United States Patent
Madala et al.

(10) Patent No.: US 10,090,805 B2
(45) Date of Patent: *Oct. 2, 2018

(54) VOLTAGE-CONTROLLED OSCILLATOR AND A METHOD FOR TUNING OSCILLATIONS

(71) Applicant: MAXLINEAR ASIA SINGAPORE PTE LTD., Singapore (SG)

(72) Inventors: Srinivasa Rao Madala, Chimakurthy (IN); Bharath Kumar Singareddy, Bangalore (IN); Hormoz Djahanshahi, Port Moody (CA); Stanley Ho, Richmond (CA)

(73) Assignee: MAXLINEAR ASIA SINGAPORE PTE LTD., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 15/346,420

(22) Filed: Nov. 8, 2016

(65) Prior Publication Data

US 2017/0187329 A1 Jun. 29, 2017

Related U.S. Application Data

(63) Continuation of application No. 14/838,022, filed on Aug. 27, 2015, now Pat. No. 9,490,746.

(51) Int. Cl.
*H03B 5/36* (2006.01)
(52) U.S. Cl.
CPC ............ *H03B 5/366* (2013.01); *H03B 5/364* (2013.01); *H03B 2201/011* (2013.01); *H03B 2201/0266* (2013.01)

(58) Field of Classification Search
CPC . H03B 5/30; H03B 5/06; H03B 5/364; H03B 220/0094; H03B 220/0034
See application file for complete search history.

(56) References Cited

U.S. PATENT DOCUMENTS 6,437,652 B1  8/2002  Gomez
6,696,899 B2  2/2004  Ruffieux
(Continued)

FOREIGN PATENT DOCUMENTS

EP  1732213  12/2006

OTHER PUBLICATIONS

Hu et al., "A 50ppm 600MHz Frequency Reference Utilizing the Series Resonance of an FBAR" IEEE Radio Frequency Integrated Circuits Symposium, 2010, pp. 325-328.
(Continued)

*Primary Examiner* — Jeffrey Shin
(74) *Attorney, Agent, or Firm* — McAndrews, Held & Malloy, Ltd.

(57) ABSTRACT

Method and systems are provided for voltage-controlling and tuning of oscillators. An oscillator may comprise comprises an oscillator core configured for contributing gain to oscillations generated in the oscillator and a frequency tuning network connected between the oscillator core and a signal source that provides an input signal for creating the oscillations in the oscillator. The frequency tuning network may be configured for tuning frequency of the oscillations, to inhibit amplifying a first capacitance from the oscillator core and to amplify a second capacitance from the frequency tuning network. The frequency of oscillations may be tuned by varying a capacitance, and isolating one or more of noise sources or parasitic capacitances from the tuning network.

20 Claims, 29 Drawing Sheets

(56) References Cited

U.S. PATENT DOCUMENTS

| | | |
|---|---|---|
| 6,828,844 B2 | 12/2004 | Suzuki et al. |
| 6,956,443 B2 | 10/2005 | Ruffieux |
| 7,002,423 B1 * | 2/2006 | Drakhlis ............ H03B 5/36 |
| | | 331/107 A |
| 7,019,598 B2 | 3/2006 | Duncan et al. |
| 7,123,109 B2 | 10/2006 | Stevenson et al. |
| 7,170,357 B1 | 1/2007 | Driscoll et al. |
| 7,312,672 B2 | 12/2007 | Yamamoto |
| 7,362,193 B2 | 4/2008 | Mattisson |
| 7,482,888 B1 | 1/2009 | Kleveland |
| 7,545,229 B2 | 6/2009 | Rohde et al. |
| 8,040,190 B2 | 10/2011 | Ruffieux |
| 8,519,800 B1 * | 8/2013 | Wagner ............ H03B 5/364 |
| | | 331/108 B |
| 9,071,194 B1 | 6/2015 | Djahanshahi et al. |
| 9,490,746 B1 * | 11/2016 | Madala ............ H03B 5/364 |
| 2006/0049883 A1 | 3/2006 | Mattisson |
| 2009/0039970 A1 | 2/2009 | Shen et al. |
| 2011/0291767 A1 | 12/2011 | Ishikawa et al. |
| 2014/0070897 A1 * | 3/2014 | Brekelmans ............ H03B 5/36 |
| | | 331/109 |

OTHER PUBLICATIONS

Ruffieux, "A High -Stability, Ultra-Low-Power Differential Oscillator Circuit for Demanding Radio Applications", Proc. of European Solid-States Circuit Conference, 2002, pp. 85-88.

Shi et al., "A Sub-100uW 2GHz Differential Colpits CMOS/FBAR VCO" IEEE Custom Integrated Circuits Conference, 2011, pp. 4 pages.

Westra et al., "Resonance-Mode Selection and Crosstalk Elimination Using Resonator-Synchronised Relaxation Oscillators", Proc. of European Solid-States Circuit Conference, 1998, 4 pages.

U.S. Appl. No. 13/909,739, Office Action dated Sep. 19, 2014.

U.S. Appl. No. 13/909,739, Notice of Allowance dated Feb. 23, 2015.

U.S. Appl. No. 14/335,842, Office Action dated Jun. 25, 2015.

U.S. Appl. No. 61/919,873, filed Dec. 23, 2013.

* cited by examiner

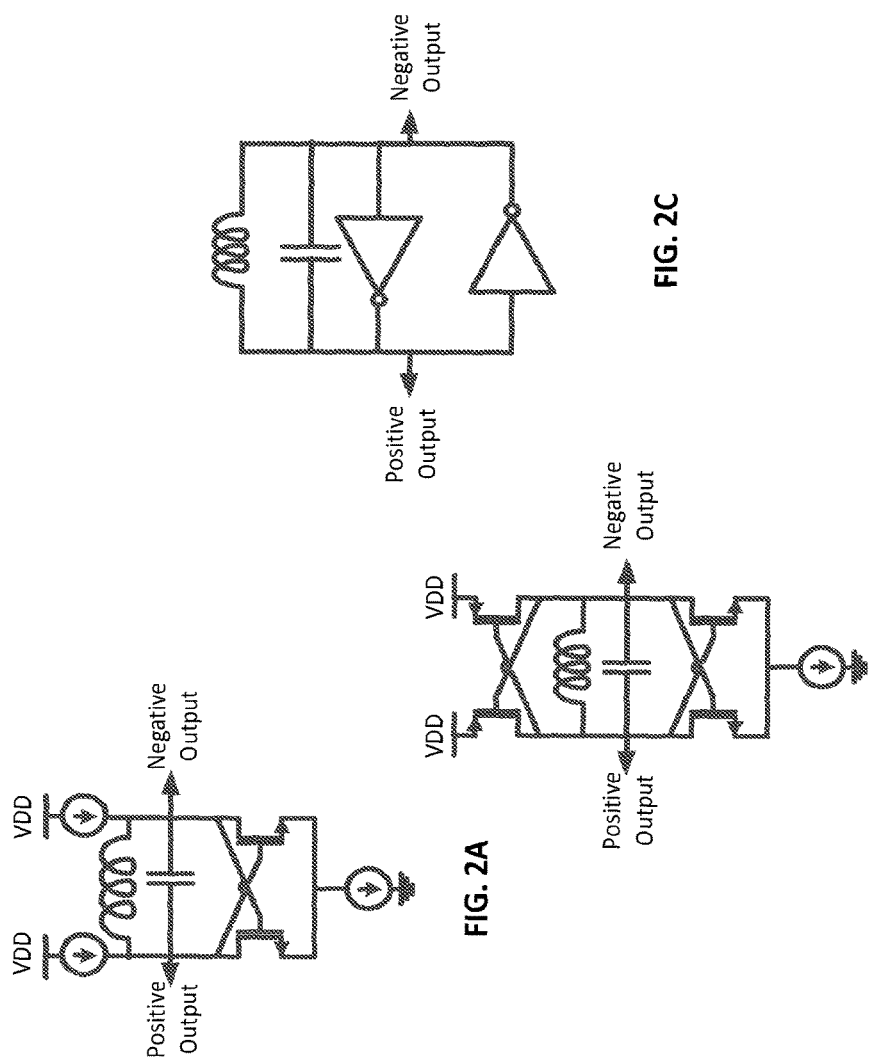

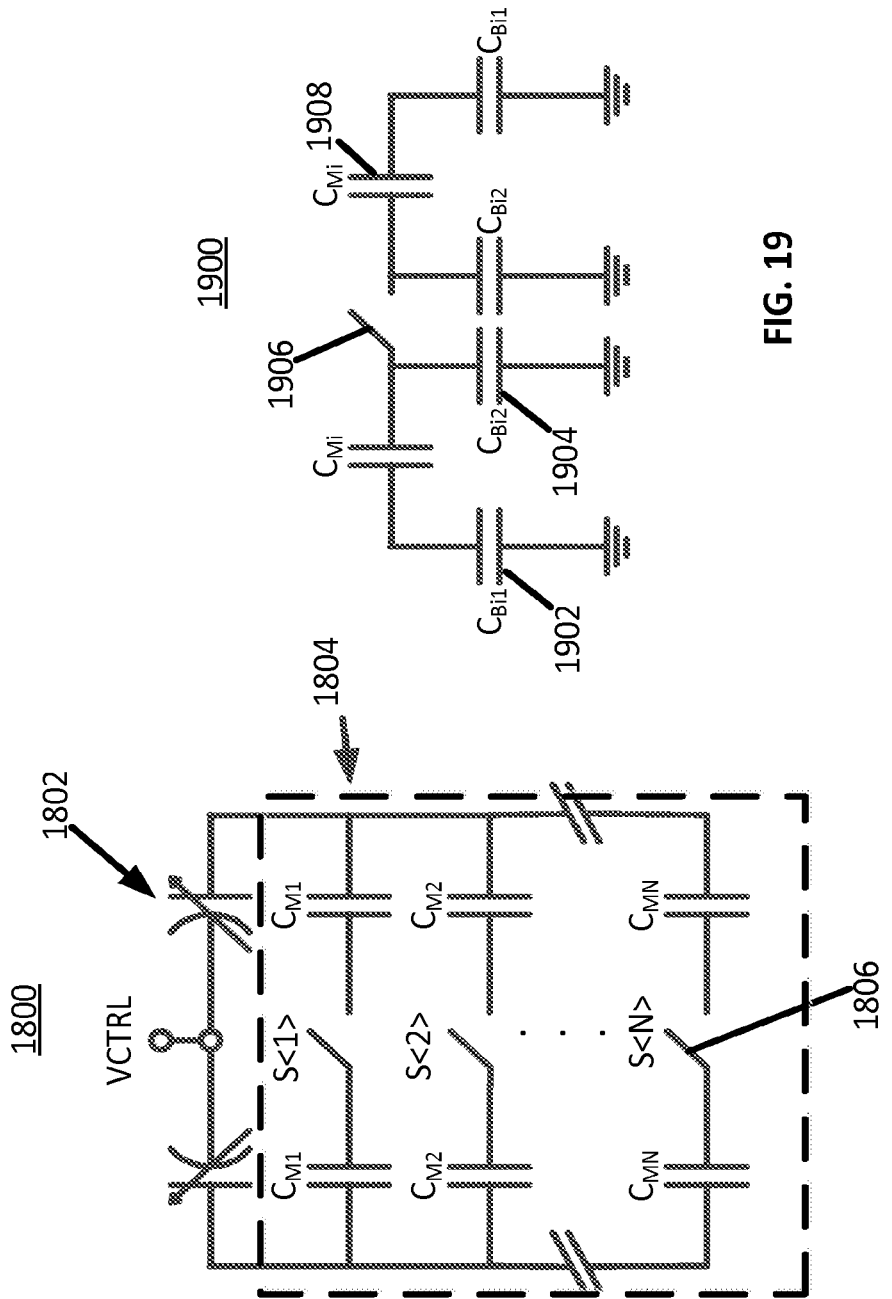

VOLTAGE-CONTROLLED OSCILLATOR AND A METHOD FOR TUNING OSCILLATIONS

CLAIM OF PRIORITY

This application is a continuation of U.S. patent application Ser. No. 14/838,022 filed Aug. 27, 2015. The above identified application is hereby incorporated herein by reference in its entirety.

FIELD

The present disclosure relates to the field of oscillators. More particularly, the present disclosure relates to tunable oscillators.

BACKGROUND

Oscillators are electrical devices that generate an oscillating or repetitive signal (oscillations). Oscillations comprise a voltage which varies in magnitude and sign over time. Oscillations can be a sinusoidal wave, such as in an analog signal, or a square wave, such as in a digital electronic signal. Oscillations generated by an oscillator, especially electronic signals, have a number of applications such as, for example, a precise reference clock source in a voltage-controlled oscillator for frequency tuning, a reference clock source in a phase-locked loop (PLL) for locking onto another signal, or a frequency synthesizer to generate many other frequency references required in specific applications including microprocessors, wireline (tethered) or wireless communication systems, and application-specific integrated circuits (ASICs).

Oscillators comprise a resonator and an oscillator core. The resonator creates the oscillations and the oscillator core provides power to the resonator to initiate and sustain oscillations. A resonator can be, for example, an inductor-capacitor (LC) resonator or an electro-mechanical resonator. LC resonators comprise an inductor and a fixed capacitor in a series or parallel configuration. A variable capacitor can also be added to an LC resonator to tune the frequency of oscillations produced by an oscillator comprising an LC resonator. Compared to an electro-mechanical resonator, an LC resonator is typically better suited for oscillators where the frequency needs to be tunable.

The use of an electro-mechanical resonator, such as a piezoelectric resonator, in place of an LC resonator can improve the quality (spectral purity) of the oscillations in an oscillator. The quality factor (as referred to as Q factor, and Q) of a resonator determines how damped its oscillator is—the higher the quality factor, the lower the rate of energy loss relative to the stored energy of the resonator. LC resonators in an integrated circuit (IC), for example, have a quality factor between 5 and 25. The quality factor of an electro-mechanical resonator can be 10 to 100 times higher than that of an integrated LC resonator.

When an electro-mechanical resonator is used with a differential oscillator, that has a common-source cross-coupled transistor oscillator core, to produce balanced oscillations, however, issues are introduced with respect to the oscillator latching to a static, non-oscillatory, direct-current (DC) stable state. Unlike an LC resonator, an electro-mechanical resonator has a very high impedance at low frequency and acts like an open circuit at DC. Although not an issue for single-ended oscillators, the high impedance at DC causes the cross-coupled transistors in a differential oscillator to become a latch with a very high DC gain so as to prevent the oscillations from starting in the oscillator. Accordingly, electro-mechanical resonators are commonly used in three-point (also known as single-ended) oscillator topologies, such as Colpitts, Pierce, and Hartley oscillators, which do not suffer from the latching problem.

FIGS. 1A, 1B and 1C show three-point electro-mechanical oscillators. Three point oscillators, however, only provide a single-ended output signal, not a differential output signal. The differential output signals, as produced by a cross-coupled oscillator with an LC resonator, have a better common-mode noise rejection and an increased oscillation swing across the resonator as compared to the single-ended output signal. The increased oscillation swing improves signal-to-noise ratio (SNR) and hence the oscillator's phase noise.

One known approach to address the latching issue is to place a degeneration capacitor in series with source terminals of the cross-coupled differential pair NMOS (or PMOS) transistors. This breaks the loop formed by the differential pair transistors and the resonator at DC, while closing the loop as desired at high frequencies. Source degeneration capacitors, however, cannot be used with oscillators comprising complementary cross-coupled inverters where each inverter comprises an NMOS and a PMOS transistor forming a complementary metal-oxide-semiconductor (CMOS) inverter gain stage. There are potential advantages to using complementary cross-coupled inverters in an oscillator such as, for example, boosting transconductance gain ($g_m$) and improving the oscillation swing and phase noise. Adding capacitors to the source with cross-coupled complementary oscillators comprising a pair of NMOS and PMOS transistors would decrease the signal swing and phase noise performance of oscillations in the oscillator. Furthermore, placing a capacitor in parallel with inverters and connected to the source of the transistors could result in unwanted parasitic relaxation oscillations. Whether relaxation oscillations occur depends on the resistance and capacitance values in the DC blocking path of the oscillator. Stability analysis can be performed to determine the largest capacitor possible to avoid relaxation oscillations, but at the expense of lower signal swing and worse phase noise performance, as well as increased design complexity. Accordingly, it would be desirable to have a cross-coupled complementary oscillator comprising an electro-mechanical resonator that does not latch to DC or experience relaxation oscillations.

Some oscillator applications, such as in telecommunications or instrumentation, require oscillations with a very precise and accurate frequency to the order of tens of parts per million (ppm) or smaller. Resonators that are built into oscillators, however, can have their resonance frequency vary in the order of hundreds of ppm to thousands of ppm for various reasons including, without limitation, fluctuations in temperature, manufacturing variations, and degradation of electronic characteristics over time, also known as aging. A variable capacitor may be placed in parallel with the resonator and the oscillator core to tune the oscillations to the desired frequency using a control voltage applied to the variable capacitor. The capacitance along with the parasitic trace or package inductance from attaching the capacitor to the circuit or other inductances can resonate together, however, and cause the oscillator to oscillate at undesired parasitic frequencies (also referred to as parasitic mode oscillations or parasitic package-mode oscillations) rather than at the resonator frequency. This is because the parasitic inductance and variable capacitance structures have a lower quality (Q) factor than the resonator allowing the parasitic oscillations to build more quickly in the oscillator than the desired resonator frequency oscillations.

Another issue is that the tuning range of an oscillator comprising the electro-mechanical resonator is much narrower than the tuning range of an oscillator comprising an LC resonator. The main reason for this is a superior frequency selectivity of an electro-mechanical resonator, which comes from its large Q factor, and in turn translates to superior phase noise performance, but inherently restricts its frequency tunability. As explained later in relation to FIG. 15, the tuning range of an electro-mechanical oscillator is limited to a narrow range between series resonance frequency 1508 ($f_s$) and parallel resonance (or anti resonance) frequency 1510 ($f_p$) of its electro-mechanical resonator.

Yet another issue is that thermal noise from the cross-coupled inverters gets translated to phase noise in the oscillations by a mechanism known as "amplitude modulation to phase modulation" (or AM-to-PM) conversion due to the modulation of the capacitance contributed by the varactors. The wider the oscillator's tunability, the more susceptible the oscillator is to AM-to-PM conversion and phase noise degradation. AM-to-PM conversion is a well-known phenomenon by which amplitude noise on oscillator nodes is converted to phase noise, mostly but not limited to because of voltage variable capacitors and supply voltage dependent stray capacitors connected to the oscillation tank. In a varactor, capacitance value is a function of the voltage across the varactor. Self-induced thermal noise and noise generated by devices connected to varactors result in amplitude modulation of the voltage across varactors leading to modulation of capacitance offered by varactors. Since the oscillation frequency and therefore its integral, namely "phase", are a function of the capacitance in the oscillation tank, which in turn is modulated by the amplitude noise, the AM (amplitude modulation) due to thermal noise is in this way converted to PM (phase modulation) and thus phase noise.

Parasitic mode oscillations tend to occur at frequencies higher than the resonator frequency. Accordingly, it would be desirable to ensure a tunable oscillator comprising an electro-mechanical resonator does not suffer from parasitic mode oscillations that can corrupt the oscillator's spectral purity.

BRIEF DESCRIPTION OF THE DRAWINGS

FIG. 2A shows a differential LC oscillator with two Pierce oscillators.

FIG. 2B shows a differential LC oscillator similar to the oscillator of FIG. 2A.

FIG. 2C shows an alternate embodiment of the differential LC oscillator shown in FIG. 2B.

FIG. 18 shows a capacitor bank of the oscillator of FIG. 6.

FIG. 19 shows a branch of the capacitor bank of FIG. 18.

DETAILED DESCRIPTION

Figure 1C:
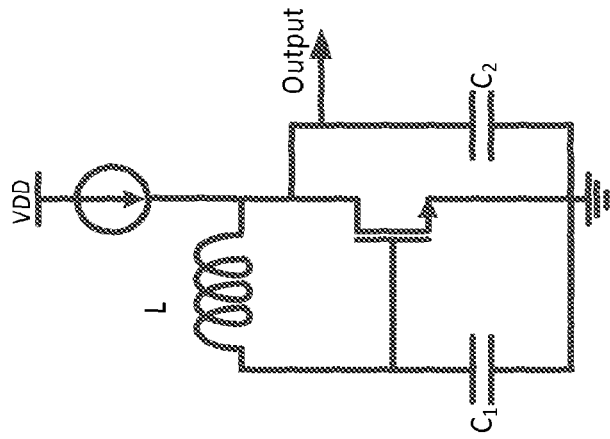
FIG. 1C shows a Pierce oscillator similar to the oscillator shown in FIG. 1A with an inductor in place of a piezoelectric resonator.

This disclosure describes a cross-coupled complementary balanced voltage controlled oscillator and a method for generating tunable balanced oscillations. The oscillator may produce a balanced or differential signal. The oscillator in accordance with an embodiment of the present disclosure comprises an electro-mechanical resonator, an oscillator core, and a frequency tuning network. The oscillator core comprises cross-coupled complementary inverters with capacitors connected to the outputs of the inverters, and a resistor network. The frequency tuning network is isolated from the oscillator core. The capacitors inhibit the inverters from latching to a static, non-oscillatory, direct-current (DC) stable state. The resistor network, when connected to the oscillator core, forms a high-pass filter with the capacitors to inhibit relaxation oscillations. The method comprises generating oscillations, tuning the frequency of the oscillations by varying a capacitance, and inhibiting one or more of noise or parasitic capacitance from impacting the effective capacitance of the tuning network.

In accordance with an embodiment of the present disclosure, an oscillator for generating oscillations having a frequency comprises: a resonator input configured to receive, from a resonator, a resonator signal for creating oscillations in the oscillator; an oscillator core connected to the resonator input, the oscillator core configured for contributing gain to the oscillations in the oscillator; and a frequency tuning network connected to the resonator input for tuning the frequency of the oscillations, the frequency tuning network connected by inductors to the oscillator core and the resonator input to inhibit amplifying a first capacitance from the oscillator core and to amplify a second capacitance from the frequency tuning network.

The oscillator core may comprise one or more transistors for contributing gain to the oscillations to generate single-ended oscillations.

The oscillator core may comprise cross-coupled transistors for contributing gain to the oscillations to generate balanced oscillations.

The oscillator core may comprise complementary cross-coupled inverters for contributing gain to the oscillations to generate balanced oscillations.

The frequency tuning network may comprise a switchable capacitor or a voltage controlled capacitor.

The resonator input may be configured to receive the resonator signal from a piezoelectric material between two electrodes.

The resonator input may be configured to receive the resonator signal from a thin-film bulk acoustic resonator, a bulk acoustic wave resonator, a surface acoustic wave resonator, a micro-electro-mechanical system resonator, or a quartz crystal resonator.

The oscillator may further comprise a resonator connected to the resonator input.

The resonator may comprise an inductor and a capacitor.

The resonator may comprise an integrated resonator comprising an inductor and a capacitor.

The inductor and capacitor may be imbedded in an IC package.

The inductor and capacitor may be discrete components on a printed circuit board.

The oscillator may further comprise an electro-mechanical resonator connected to the resonator input.

The resonator may be a thin-film bulk acoustic resonator, a bulk acoustic wave resonator, a surface acoustic wave resonator, a micro-electro-mechanical system resonator, or a quartz crystal resonator.

The frequency tuning network may comprise: capacitors switchably connected to the resonator input to form one or more switchable capacitor connections; and a controller configured to enable the one or more switchable capacitor connections to decrease the frequency of the balanced oscillations in the oscillator, and to disable the one or more switchable capacitor connections to increase the frequency of the balanced oscillations in the oscillator.

The inductance may be configured to inhibit a thermal noise from the oscillator core from converting to a phase noise in the frequency tuning network.

In accordance with an embodiment of the present disclosure, an oscillator for generating oscillations having a frequency comprises: a resonator input configured to receive, from a resonator, a resonator signal for creating oscillations in the oscillator; an oscillator core connected to the resonator input, the oscillator core for contributing gain to the oscillations in the oscillator; and a frequency tuning network connected to the resonator input for tuning the frequency of the oscillations, the frequency tuning network connected by inductors to the oscillator core and the resonator input to isolate a parasitic capacitance or a noise source of the oscillator core from the frequency tuning network and to amplify a capacitance from the frequency tuning network.

The parasitic capacitance or the noise source may be in the oscillator core.

In accordance with an embodiment of the present disclosure, an oscillator for generating oscillations having a frequency comprises: a resonator input configured to receive, from a resonator, a resonator signal for creating oscillations in the oscillator; an oscillator core connected to the resonator input, the oscillator core comprising inverters for contributing gain to the oscillations in the oscillator, the inverters generating a thermal noise; and a varactor connected by inductors to the oscillator core for tuning the frequency of the oscillations, the inductors for inhibiting conversion of a thermal noise to a phase noise by the varactor.

In accordance with an embodiment of the present disclosure, an oscillator for generating balanced oscillations having a frequency comprises: a resonator input configured to receive, from an electro-mechanical resonator, a resonator signal for creating oscillations in the oscillator; an oscillator core connected to the resonator input for starting and sustaining balanced oscillations in the oscillator, the oscillator core comprising first and second cross-coupled complementary inverters forming a first and second loop with the resonator input, each inverter comprising an output; first and second capacitors connected at the outputs of the first and second cross-coupled complementary inverters in series in the first and second loops, respectively, the capacitors configured to inhibit the cross-coupled complementary inverters from latching to a non-oscillatory direct current stable state when starting balanced oscillations; and a resistor network connected to the capacitors and to the inverters for creating a high-pass filter with the capacitors to inhibit relaxation-mode oscillations; and a frequency tuning network connected to the resonator input for tuning the frequency of the balanced oscillations, the frequency tuning network connected in series with inductors to the oscillator core and the resonator input to inhibit amplification of parasitic capacitance from the oscillator core and to amplify a variable capacitance of the frequency tuning network as seen by the resonator input.

In accordance with an embodiment of the present disclosure, a method for tuning a frequency of oscillations in an oscillator comprises: generating oscillations in the oscillator using a resonator; amplifying the oscillations with an oscillator core; varying a capacitance connected in parallel with the resonator and the oscillator core to tune the frequency of the oscillations; and inhibiting amplification of capacitance from the oscillator core using an inductance connecting the oscillator core with the frequency tuning network.

Generating oscillations may comprise generating balanced oscillations.

Generating oscillations may comprise generating single-ended oscillations.

The method may further comprise inhibiting a noise from the oscillator core from reaching the capacitance using the inductance.

The method may further comprise inhibiting a parasitic capacitance from reaching the resonator using the inductance.

Varying the capacitance may comprise increasing the capacitance to decrease the frequency of the oscillations.

Varying the capacitance may comprise decreasing the capacitance to increase the frequency of the oscillations.

In accordance with an embodiment of the present disclosure, an electronic system-in-package (SiP) oscillator comprises: an integrated circuit (IC) package comprising an electro-mechanical resonator consisting of a film bulk acoustic resonator (FBAR) or a bulk acoustic wave resonator (BAW) for creating oscillations in the oscillator at a frequency greater than 1 gigahertz; a semiconductor integrated circuit connected to the IC package by I/O pads, the semiconductor integrated circuit comprising: an oscillator core for contributing a gain to the oscillations from the resonator to generate balanced oscillations, the oscillator core comprising: first and second cross-coupled complementary inverters forming a loop, each inverter comprising an output; first and second capacitors connected in series in the loop to the outputs of the first and second cross-coupled complementary inverters, respectively, and configured to inhibit the cross-coupled complementary inverters from latching to a non-oscillatory direct-current (DC) stable state when starting oscillations; and a resistor network connected to the capacitors and to the inverters for creating a high pass filter with the capacitors to inhibit relaxation-mode oscillations; and a frequency tuning network connected to the oscillator core in series with inductors and I/O pads, the frequency tuning network configured to tune a frequency of the balanced oscillations.

Other aspects and features of the present disclosure will become apparent to those ordinarily skilled in the art upon review of the following description of specific embodiments in conjunction with the accompanying figures.

Before discussing these embodiments in detail, a more detailed description of electro-mechanical oscillators is provided.

Figure 1B:
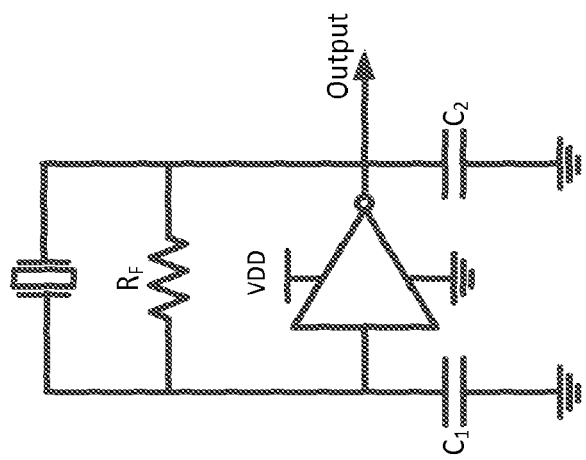
FIG. 1B shows an inverter based Pierce oscillator similar to the oscillator shown in FIG. 1A.
Figure 1A:
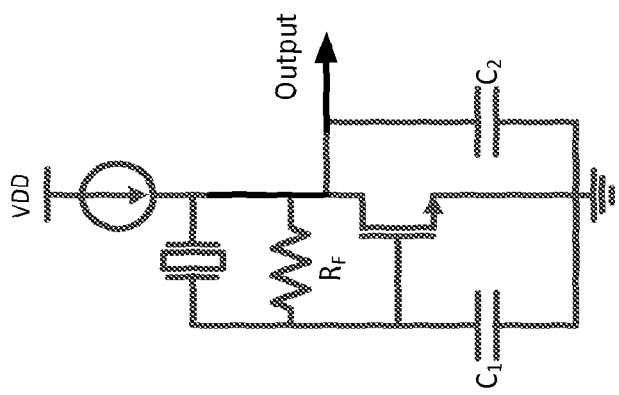
FIG. 1A shows a Pierce oscillator with a single transistor and a piezoelectric resonator.

As described in the background section, FIGS. 1A-C show three-point single-ended oscillators. FIG. 1A shows a Pierce oscillator with a single transistor and a piezoelectric resonator. A feedback resistor ($R_F$) determines a bias point. The feedback resistor is sufficiently large to not impact the oscillator during operation. Capacitors $C_1$ and $C_2$, together with the piezoelectric resonator determine the phase shift necessary to cause oscillations in the oscillator. The transistor starts and maintains oscillations in the oscillator by providing loop gain and hence replenishing energy loss (e.g. losses from the resonator, capacitor, and/or interconnections) due to the finite Q of the resonator. The gain and phase conditions to sustain oscillation are collectively known as Barkhausen criteria. FIG. 1B shows a Pierce oscillator similar to the oscillator shown in FIG. 1A, the difference being that the current source is replaced with a PMOS transistor. The PMOS transistor's gate is connected to the gate of the NMOS transistor to create a CMOS inverter with $g_m$-boost. FIG. 1C shows an oscillator similar to the oscillator shown in FIG. 1A, the difference being that the oscillator uses an inductor instead of the piezoelectric resonator. The feedback resistor is not required because the inductor provides the DC bias path for the transistor input. The Q factor of the inductor is much smaller than that of the piezoelectric resonator in FIGS. 1A and 1B.

A balanced or differential oscillator can provide oscillations with less phase noise, better clock symmetry, and better common-mode noise immunity than oscillations from a single-ended oscillator.

FIGS. 2A-C show differential or cross-coupled oscillators having an LC resonator. FIG. 2A shows a differential LC oscillator with two Pierce oscillators, similar to as shown in FIG. 1C, in a back-to-back configuration. The transistors are cross-coupled to one another and, accordingly, this type of oscillator is also known as a cross-coupled oscillator or negative-$g_m$ oscillator. The oscillator also has a common-source. FIG. 2B shows a differential LC oscillator similar to the oscillator of FIG. 2A, the difference being that the oscillator also has a pair of cross-coupled PMOS transistors. This type of oscillator is known as a cross-coupled complementary oscillator. Since the oscillator has $g_m$-boost and symmetric circuitry, it achieves a higher oscillation swing and better phase-noise performance as compared to the oscillator of FIG. 2A. The oscillator is typically used in systems-on-chips for different applications because of its high performance and easy on-chip integration, which allows for compact implementations. FIG. 2C shows an alternate embodiment of the differential LC oscillator shown in FIG. 2B, the difference being that it does not have a tail current source.

A differential oscillator comprising an electro-mechanical resonator, however, has a very high open-loop DC gain which can cause the oscillator to latch to static, non-oscillatory, direct-current (DC) stable levels to prevent oscillations. Specifically, at DC where the oscillation frequency f is equal to 0, the resonator is capacitive and has infinite impedance. The oscillator reduces simply into a back-to-back inverter (a.k.a. flywheel) configuration where the positive feedback of the flywheel amplifies the noise or mismatch so that the output will latch to static, non-oscillatory, voltage levels, namely, the voltage level of the supply rails. As a result, this type of oscillator circuit cannot "self-start" the oscillation. This is unlike an LC resonator based cross-coupled oscillator where at DC the parallel LC resonator is essentially a short circuit. The short circuit is due to the inductor, which suppresses the DC gain. The prior art attempts to address the described start-up problem with electro-mechanical resonators by adding one or more components such as DC-blocking capacitors, feedback loops, and second resonators. These components add extra cost and complexity to the oscillator, reduce signal swing, degrade noise performance, and push the DC latch problem to a higher frequency so as to cause relaxation oscillations.

Figure 3B:
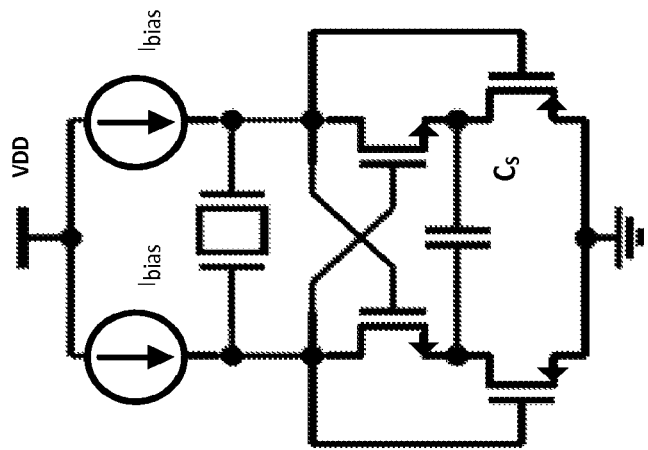
FIG. 3B shows an enhanced cross-coupled oscillator similar to the oscillator of FIG. 3A.
Figure 3A:
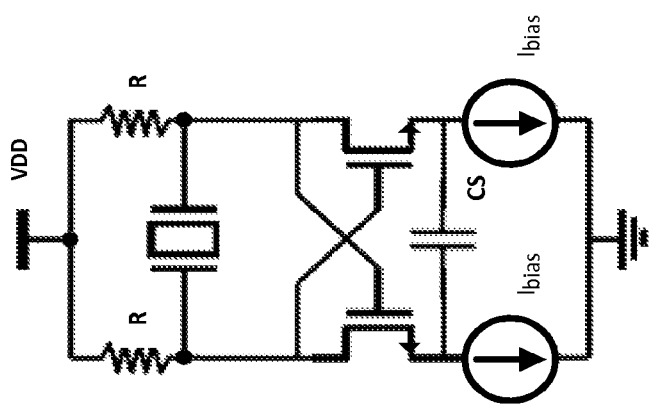
FIG. 3A shows a cross-coupled oscillator with an electro-mechanical resonator.

FIG. 3A shows a cross-coupled oscillator as described in *Resonance-Mode Selection and Crosstalk Elimination Using Resonator-Synchronized Relaxation Oscillators*, J. R. Westra et al., *Proc. of European Solid-States Circuit Conference*, 1998. The oscillator comprises cross-coupled NMOS transistors and an electro-mechanical resonator. The sources of the NMOS transistors are connected by a capacitor $C_S$. The capacitor opens the loop formed by the transistors and resonator at DC and closes the loop as desired at high frequencies to provide the required gain for oscillations to start. Although the capacitor helps inhibit the oscillator from latching to DC, this configuration suffers from several drawbacks such as spurious relaxation oscillations and inferior phase noise performance. At low frequency, when the oscillator is starting operation, the resonator still has very high impedance. This can cause relaxation oscillations to occur in the oscillator. The relaxation oscillations predominantly depend on the value of the capacitor $C_S$, combined with impedances seen at the source of the cross-coupled pair. The relaxation oscillation could occur at the same time as the main oscillation so as to appear as sidebands in the output signal. Alternatively, the relaxation oscillation could overcome the main oscillation. Stability analysis can be performed to determine the largest capacitor possible to avoid relaxation oscillations, but at the expense of lower signal swing and worse phase noise performance. The gate bias voltage is also not deterministic and relies on the current sources and the resistors.

FIG. 3B shows a cross-coupled oscillator similar to the oscillator of FIG. 3A, the difference being that the current sources are replaced with a second pair of NMOS transistors, the gates of which are connected to the drains of the first pair of NMOS transistors to set the drain common-mode voltages by providing DC feedback. However, due to headroom limitations from the stacked transistors, this oscillator still suffers from a low voltage swing and degraded phase noise.

Figure 4B:
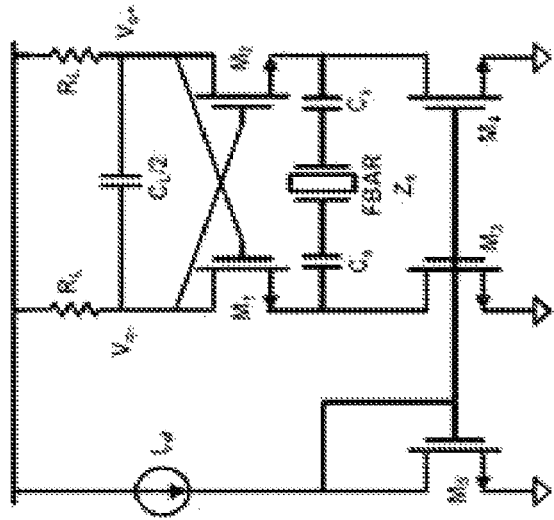
FIG. 4B shows a balanced oscillator with the electro-mechanical resonator and DC-blocking capacitors at the source.
Figure 4A:
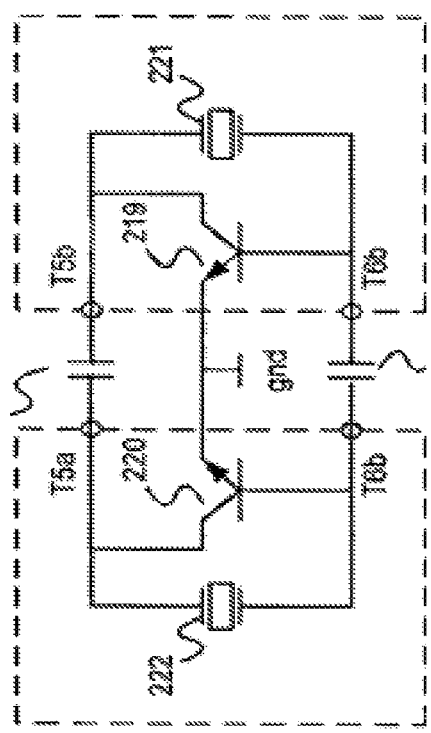
FIG. 4A shows a bipolar balanced oscillator having two electro-mechanical resonators and DC-blocking capacitors.

FIG. 4A shows a bipolar balanced oscillator having two resonators and blocking capacitors as described in U.S. Pat. No. 7,362,193 to Mattisson. Since two resonators are required, however, this increases the amount of area used in an IC package or on a printed circuit board, and increases the bill of materials. Also, mismatch of the resonators can affect circuit performance.

FIG. 4B shows a balanced oscillator as described in *A 50 ppm 600 MHz Frequency Reference Utilizing the Series Resonance of an FBAR*, Brian Otis, *IEEE Radio Frequency Integrated Circuits Symposium*, 2010. The resonator is located between, but isolated by capacitors from, the sources of the cross-coupled transistors to eliminate the DC gain. The cross-coupled loop closes at the resonance frequency formed by the thin-film bulk acoustic wave resonator (TF-BAR or FBAR) in series with capacitors $C_S$. The oscillator suffers from phase noise degradation and may potentially oscillate at unwanted frequencies.

Figure 5A:
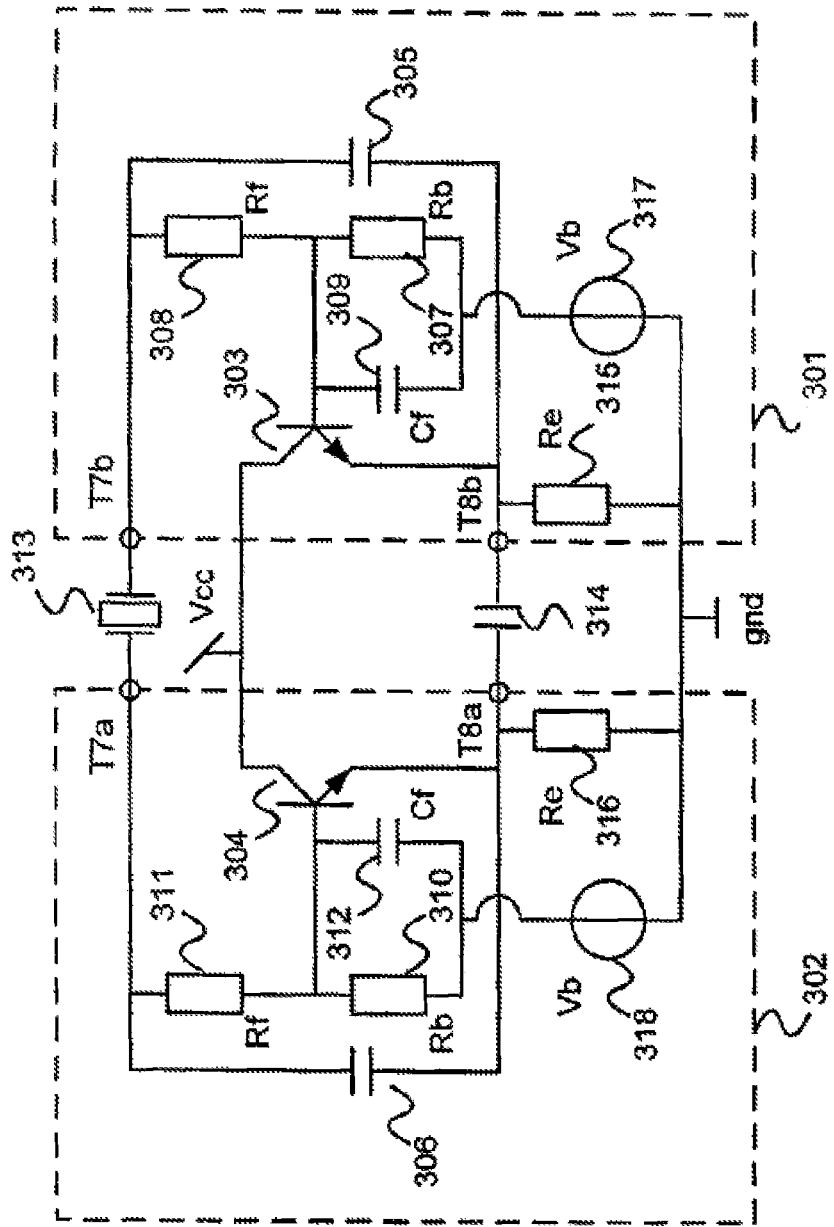
FIGS. 5A and 5B show Colpitts differential oscillators having an electro-mechanical resonator.
Figure 5B:
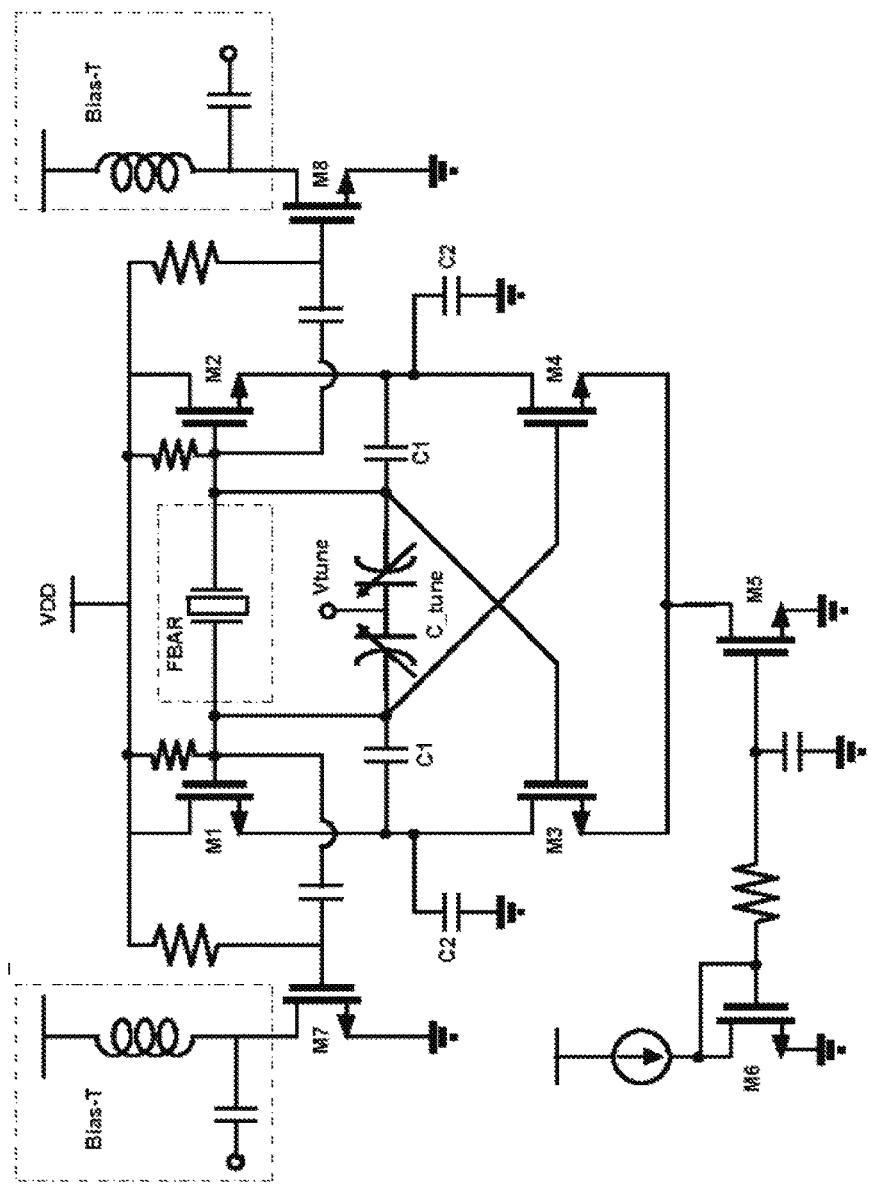

FIGS. 5A and 5B show Colpitts differential oscillators having a piezoelectric resonator as disclosed in U.S. Pat. No. 7,362,193 to Mattisson and *A Sub-100 uW 2 GHz Differential Colpitts CMOS/FBAR VCO*, Brian Otis, *IEEE Custom Integrated Circuits Conference*, 2011, respectively. Each oscillator has a pair of cross-coupled transistors that share a common-drain. The output of each oscillator is at the source of the transistors, while in a Pierce oscillator the output is at the drain of the cross-coupled pair. Although the Colpitts oscillators do not have the DC latch problem, the oscillators require a biasing circuit and a lower voltage gain that requires $g_m$-boosting to help start the oscillations. This lowers the voltage headroom and complicates the oscillator design.

Commonly assigned U.S. Pat. No. 9,071,194, which is herein incorporated by reference in its entirety, discloses an oscillator and method for generating balanced oscillations using an electro-mechanical resonator and cross-coupled complementary transistors (also referred to as inverters). Complementary means a combination of a P-type transistor and an N-type transistor such as, for example, a complementary metal oxide semiconductor inverter also referred to as a CMOS inverter. To avoid the oscillator latching to DC, the oscillator starts the oscillations in single-ended mode by disabling one of the inverters. Starting in single-ended mode allows the oscillator to accumulate energy to kick-start the oscillator into balanced mode. Specifically, once oscillations are established, the oscillator transitions to differential or balanced mode by enabling both inverters. The oscillator also has a switchable bank of resistors in parallel with both inverters. The switchable bank of resistors is enabled to maximize shunt resistance at start-up, and disabled to minimize shunt resistance when transitioning to differential mode, then maximized again when operating in differential mode at steady state.

In contrast to existing approaches, the present disclosure describes a tunable cross-coupled complementary oscillator comprising an electro-mechanical resonator and an oscillator core that does not latch to a static, non-oscillatory DC stable state, that inhibits low-frequency relaxation mode oscillations, and that commences oscillations directly in balanced mode.

Frequency synthesizers require tunable oscillators because of the frequency inaccuracies of the resonators, resonator frequency drift due to changes in temperature and aging, and variabilities in loading and drive strength of oscillator circuitry due to manufacturing tolerances. Oscillators comprising an electro-mechanical resonator such as a piezoelectric resonator can be tuned by adjusting the capacitance value in a resonator tank, either through voltage-controlled variable capacitors (varactors) or a switchable capacitor bank, assuming the output frequency is between the series resonance frequency ($f_S$) and the parallel resonance frequency ($f_P$) of the resonator. There are limits, however, to the maximum-to-minimum (or on-to-off) capacitance ratio due to the parasitic capacitance in the oscillator circuitry and the Q value required for a particular application. In deep sub-100 nm CMOS, for example, an on-to-off capacitance ratio of 6-to-1 or smaller in a switchable capacitor bank may be achieved with a satisfactory Q value. Generally, however, a tunable oscillator comprising a piezoelectric resonator requires a higher on-to-off capacitance ratio. Furthermore, tuning the oscillator frequency by a linear amount requires an exponential change in capacitance, as further explained below in relation to FIGS. 17A and 17B which show examples plots of the effective inductance of an mBVD model of an oscillator. The present disclosure also describes an apparatus and method for reducing the required on-to-off capacitance ratio in a cross-coupled complementary balanced oscillator comprising an electro-mechanical resonator while maintaining a large tuning range.

Figure 6:
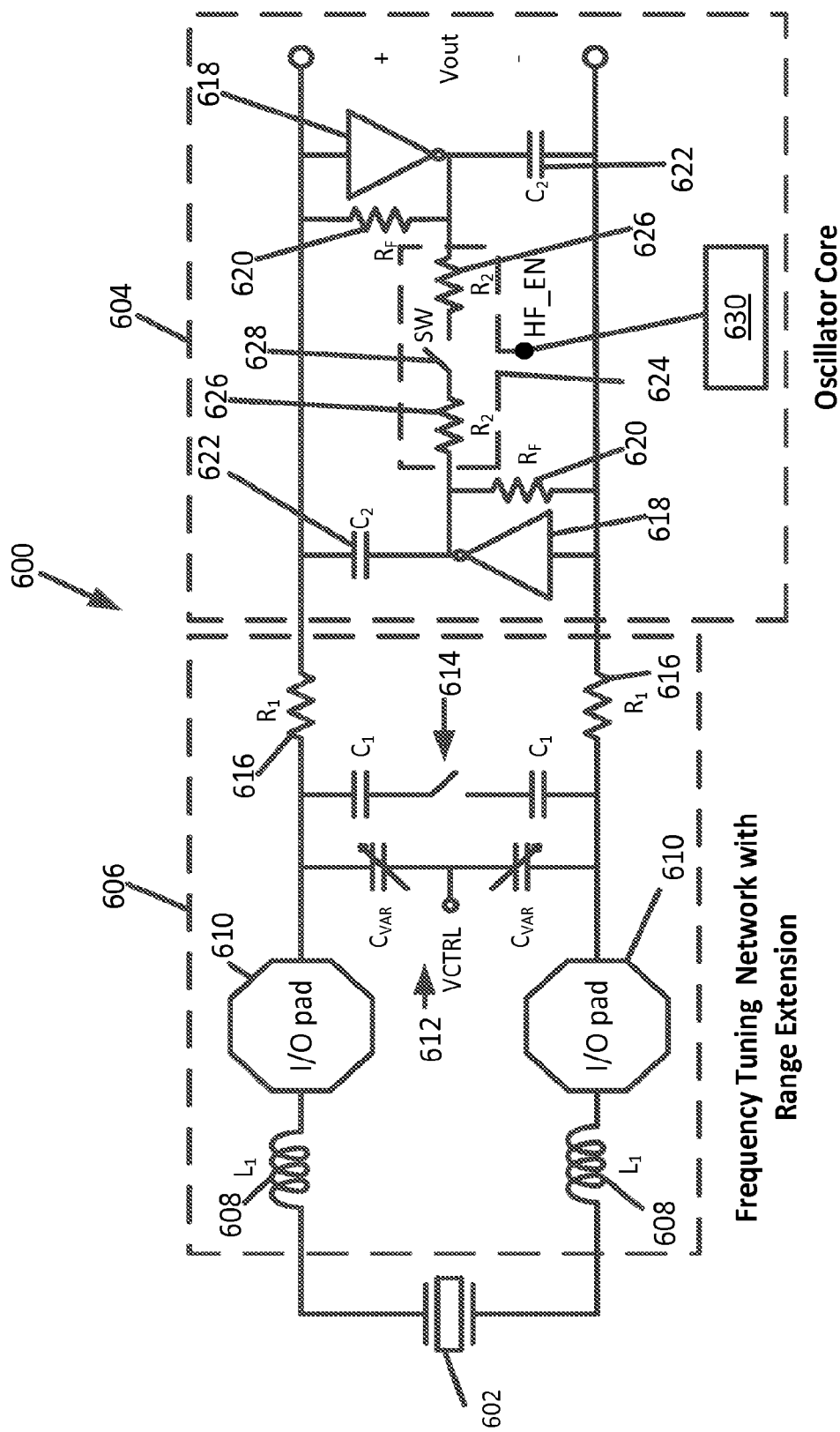
FIG. 6 shows a complementary cross-coupled voltage controlled oscillator in accordance with an embodiment of the present disclosure.

FIG. 6 shows a cross-coupled complementary voltage-controlled oscillator 600 (VCO) in accordance with an embodiment of the present disclosure. This oscillator 600 can be used in, for example, high performance phase-locked loops (PLLs) to generate a precise frequency reference that demands a very good phase noise performance. The oscillator 600 comprises an electro-mechanical resonator 602, an oscillator core 604, and a frequency tuning network 606. The resonator 602 is for creating a signal (also referred to as oscillations) at a desired frequency while suppressing other frequencies, the oscillator core 604 is for contributing gain to the resonator signal (oscillations) for starting and sustaining the balanced oscillations, and the tuning network 606 is for extending the frequency tuning range of the oscillator 600.

The resonator 602 can be, for example, any high-Q resonator including, without limitation, a Film Bulk Acoustic Resonator (FBAR), Bulk Acoustic Wave resonator (BAW), a Surface Acoustic Wave resonator (SAW), a Micro-Electro-Mechanical System resonator (MEMS), or a quartz crystal (XTAL) resonator. The resonator 602 is connected in parallel with the frequency tuning network 606 and oscillator core 604. The resonator 602 is connected in series with inductors 608 and I/O pads 610 in the frequency tuning network 606. The resonator 602, inductors 608, variable capacitors (varactors or $C_{VAR}^S$) 612, and switched capacitors 614 form a resonator tank.

In an embodiment of the present disclosure, the oscillator 600 comprises a resonator input. The resonator input may be any electrical connection capable of receiving, so as being connected to, the resonator 602 and is not limited to resonator terminals. The resonator input is for connecting the resonator 602 to the other elements of the oscillator 600 as show in FIG. 6. The resonator input receives a signal from the resonator 602 which is used by the other elements in the oscillator 600 to creates oscillations.

Resistors 616 connect the resonator tank to the oscillator core 604. Resistors 616 act as low-pass filters to help suppress unwanted high-frequency oscillations due to the parasitic inductances of the IC package or the inductances 608, or overtone oscillation modes of the resonator 602 itself. Resistors 616 suppress the package resonance oscillation at an unwanted frequency created by the on-die switched capacitors 614, the on-die varactors 612, and the parallel plate capacitance of resonator 602. The inductors 608 are implemented on the IC package as they require high Q. Integrated inductors on silicon are generally too lossy for high-performance applications. The inductors 608 can be implemented by means of traces on a flip-chip (FC) package, or bond wires in a more traditional wirebond IC package.

Parasitic mode oscillations tend to occur in high-frequency oscillators, due to available gain at a high frequencies, or in oscillators comprising a tuning network. With respect to oscillators operating in the multi-gigahertz frequencies, package inductances create high-frequency parasitic-mode oscillations with oscillations that are typically at a frequency which is only a couple of times higher than the frequency of the desired resonator oscillations. Because the frequencies are so close, low-pass filtering the parasitic mode oscillations may not be possible without adversely impacting the desired resonator oscillations. With respect to oscillators comprising a tuning network, the tuning capacitors tend to degrade (reduce) the peak gain of the oscillator at the desired resonator frequency, and also create a new undesired resonance mode based on the package parasitic inductances.

The oscillator core 604 comprises two cross-coupled complementary inverters 618, two self-biasing feedback resistors 620, two capacitors 622, a resistor network 624, and a controller 630. The cross-coupled complementary inverters 618 each form a series circuit or loop with the resonator 620. A self-biasing feedback resistor 620 is in parallel with each of the cross-coupled inverters 618.

The inverters can comprise any type of transistors including, without limitation, metal-oxide-semiconductor (MOS) transistors, bipolar junction transistors (BJT), and junction field-effect transistors (JFET). The self-biasing feedback resistors 620 set a bias point of the inverters for maximum small-signal transconductance gain ($g_m$) in order to maximize the loop gain in the oscillator 600.

A capacitor 622 is connected in series in each of the loops to the output of each cross-coupled complementary inverter 618. In other words, the terminals of each capacitor 622 connect the output of one inverter 618 to the input of the other inverter 618. The inverter 618 and capacitor 622 structure is cross-coupled (connected back-to-back) with another inverter 618 and capacitor 622 structure. Effectively, the inverters 618 are capacitively cross-coupled with one another. The capacitors 622 inhibit the cross-coupled complementary inverters 618 from latching to a direct current (DC) state when starting oscillations by breaking the positive feedback loop.

The resistor network 624 comprises resistors 626 and a switchable connection 628 for connecting the outputs of the inverters 618 in series with the resistors 626. The resistor network 624 is also known as a switchable shunt resistor. The resistor network 624, in combination with the capacitors 622, provide a high pass filter to help eliminate unwanted low-frequency relaxation-mode oscillations. The switchable connection 628 is enabled and disabled according to a signal from the controller 630 at enable input HF_EN. In the embodiment of FIG. 6, the resistor network 624 comprises a pair of resistors 626 with a switchable connection 628 therebetween. In an alternate embodiment, the resistor network 624 comprises a pair of switchable connections 628 between a pair of resistors 626 to preserve full implementation symmetry. In a further embodiment, a resistor 626 can be placed in between two switchable connections 628. The resistor network 624 may comprise multiple branches of resistors paired with switchable connections to form an array of programmable switched resistors.

When oscillations are started in the oscillator 600, the controller 630 enables the switchable connection 628. When the resistor network 624 is connected to the oscillator 600, a high-pass filter is created by the capacitors 622 and the resistors 626. The high pass filter inhibits parasitic and undesirable relaxation-mode oscillations from occurring in the oscillator 600. In another embodiment, the resistor network 624 has no switchable connection so that it is always connected between the outputs of the inverters 618. Accordingly, there is no start-up sequence. This embodiment could be used for low-cost applications with ordinary phase noise performance requirements.

Figure 7:
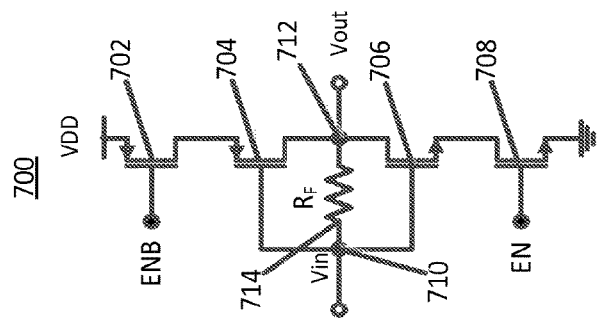
FIG. 7 shows an embodiment of the inverter of the oscillator shown in FIG. 6.

FIG. 7 shows an inverter 700, which is similar to inverters 618, including feedback resistor 620, shown in FIG. 6. The inverter 700 comprises two PMOS transistors 702, 704 and two NMOS transistors 706, 708, all connected in series. Voltage supply VDD is connected to the source of PMOS transistor 702. The gate of PMOS transistor 702 is connected to and controlled by input ENB, and the gate of NMOS transistor 708 is connected to and controlled by input EN. Inputs EN and ENB receive complementary signals and simultaneously enable or disable the transistor switches 702 and 708. One of the PMOS transistors 704 and one of the NMOS transistors 706 are connected at their gates and drains. The gates are connected to an input 710, and the drains are connected to an output 712. Feedback resistor 714 (same as feedback resistor 620 in FIG. 6) connects input 710 and output 712.

Figure 8:
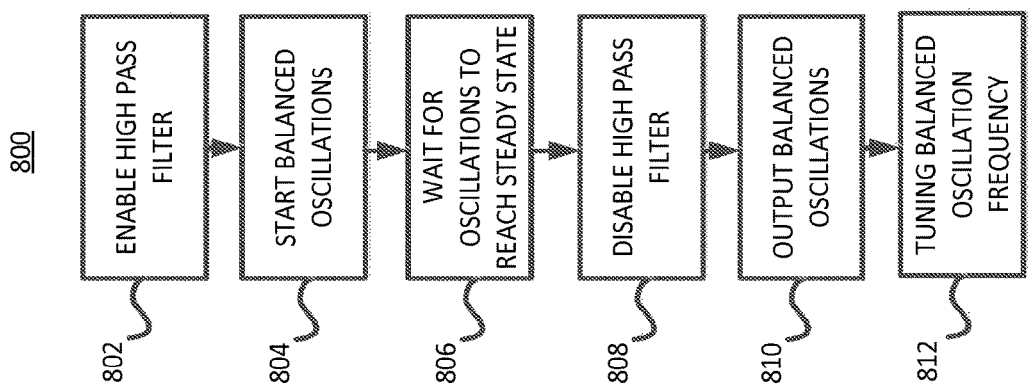
FIG. 8 shows a flowchart of a process for operating the oscillator of FIG. 6.

Referring back to FIG. 6, the capacitors 622 are located at the outputs of the inverters 618 (drains of PMOS transistor 704 and NMOS transistor 706 of FIG. 8). This arrangement of the capacitors 622 effectively breaks the positive feedback loop of the cross-coupled complementary inverters 618 at DC, while shorting (closing) the loop at high frequencies. Although capacitors 622 serve a similar purpose as the capacitors in the prior art, the locations of the capacitors 622 are different. By breaking the loop at the outputs of the inverters 618 (drain of the transistors) with the locations of the capacitors 622, a complementary cross-coupled structure can be used together with an electro-mechanical resonator to produce a balanced output without latching to DC. Also, because there is no loop gain at DC, the oscillator 600 can immediately start building an oscillatory differential output signal when it first commences operation, and does not need to start in single-ended mode.

The undesired relaxation-mode oscillations potentially created by time constants associated with the DC blocking capacitors may be eliminated by a high-pass filter. When enabled, the switchable resistor network 624, in combination with the capacitors 622, together create a high-pass filter to eliminate low-frequency relaxation-mode oscillations. Prior art approaches that use source degeneration capacitance also suffer from the potential relaxation oscillation problem. For the prior art, stability analysis needs to be conducted to determine a capacitance value that avoids creating relaxation oscillations without increasing the phase noise in the oscillations. On one hand, too small of a capacitance value increases phase noise due to lower loop gain and hence lower oscillation swing. On the other hand, too large of a capacitance value will create relaxation oscillations. In an embodiment of the present disclosure, a high-pass filter and a startup procedure for enabling and disabling the high-pass filter are provided to allow the oscillator 600 to maintain phase noise performance while eliminating the size constraint on capacitors 622 due to the stability limits. In other words, the capacitors 622 can be sized relatively large so that there is no phase noise degradation, and resistors 626 can be sized accordingly to filter out the relaxation gain to prevent the relaxation oscillation from building up at the start-up phase. When the oscillator 600 reaches steady state oscillations, high-pass filtering is no longer required because relaxation oscillations are already suppressed by the resonator oscillations and will not start in this state. Accordingly, the switchable resistor network 624 is disabled by opening the switch 628, and the branch becomes an open circuit to help achieve high swing and high phase noise performance. Alternatively, to reduce the controller complexity the switchable resistor network 624 can remain enabled, or simplified to a fixed resistor without a switch, for less demanding low-cost applications.

FIG. 8 shows a flowchart of a method 800 for operating the oscillator 600 of FIG. 6 in accordance with an embodiment of the present disclosure. The method comprises enabling a high pass filter 802 in the oscillator, starting balanced oscillations in the oscillator 804, waiting for balanced oscillations to reach a steady state 806, disabling the high-pass filter 808 in response to oscillations reaching a steady state, outputting the balanced oscillations as a signal 810, and tuning the frequency of the balanced oscillations 812. In another embodiment, the high-pass filter is always enabled so that the step of disabling the high-pass filter 808 is not performed, thus reducing the control complexity. Although this latter embodiment suffers from phase noise degradation (i.e. increased phase noise), it may be used in low-cost, low-complexity, and low-performance applications.

Before starting the balanced oscillations 804, the controller 630 enables or activates the high-pass filter 802 by sending a signal to input HF_EN to enable the resistor network 624. Effectively, a signal at input HF_EN activates (closes) the switch 628 to connect the resistors 626 in the oscillator core 604 and form the high-pass filter with the capacitors 622 and the input impedance of the inverting gain stage.

To start oscillations 804 in the oscillator 600, a power supply voltage is applied to the oscillator core 604 to energize the circuitry of the oscillator 600. This causes the electro-mechanical resonator 602 to commence resonating at a frequency to produce balanced oscillations in the oscillator 600. The capacitors 622, which are at the output of the inverters 618, inhibit the inverters 618 from latching to DC state. The high-pass filter is for eliminating relaxation mode oscillations, potentially caused by the capacitors 622 and feedback resistors 620, without affecting high frequency gain at the desired oscillation frequency. The resistors 626 typically have small resistance values that help the high-pass filter provide attenuation at low frequencies.

When the resistors 626 are connected, the oscillator 600 is considered to be in "low-swing" mode. In low-swing mode, the oscillator 600 can accumulate balanced oscillations to reach the desired oscillation frequency. The oscillator 600 then waits 806 a period of time to allow balanced oscillations to stabilize at the desired frequency so as to reach a sustainable or steady-state large-signal operation. Sustainable or steady-state balanced oscillations are reached when the oscillation amplitude is stable which means that there is large-signal unity gain, or a gain of 0 decibels, at the desired oscillation frequency and the gain at any other frequency, such as relaxation frequency, is less than 0 decibels.

Once oscillations in the oscillator 600 reach a sustainable or steady-state large-signal at the desired frequency and amplitude (swing), the high pass filter is disabled 808 by the controller 630 by sending a signal to input HF_EN. This opens or deactivates the switch 628 which disconnects the resistors 626 from the oscillator 600 to create an open circuit. Disabling the high pass filter reduces phase noise by increasing the amplitude of the balanced oscillations in the oscillator. The balanced oscillations are output 810 by the oscillator as a differential signal. A differential signal comprises a pair of signals with common-mode noise rejection property, but a phase difference of 180 degrees.

The frequency of the balanced oscillations in the oscillator 600 can be tuned 812 by varying the capacitance in the oscillator 600. Varactors 612 can be controlled by a control voltage at input VCTRL to change the capacitance in the tuning network 606 of oscillator 600. Also, the switch for connecting the switched capacitors 614 to the oscillator 600 can be closed to change the capacitance in the oscillator 600.

Figure 9A:
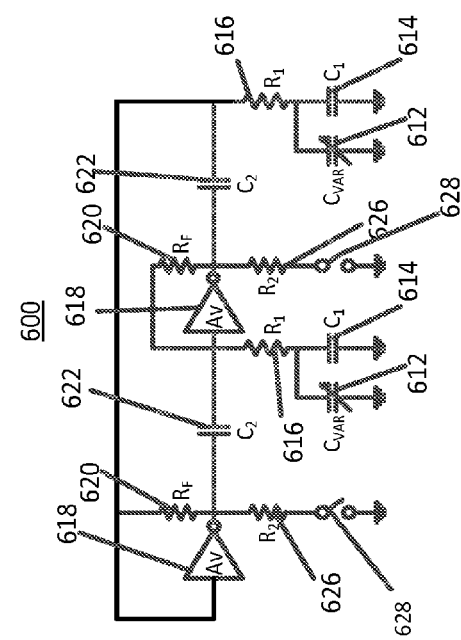
FIGS. 9A and 9B show simplified circuit diagrams of the oscillator of FIG. 6 at low frequencies, with a switchable resistor when disabled and enabled, respectively.

FIG. 9A shows a simplified circuit diagram of the oscillator 600 of FIG. 6 at low frequencies (where the resonator is approximated as an open-circuit) and when input HF_EN is disabled and hence the resistors 626 are not connected to the oscillator 600. The oscillator 600 is in single-ended mode. The circuit of FIG. 9A is not a desired configuration when first commencing oscillations in the oscillator 600 and is shown only for the purposes of explanation. At low frequency, the resonator 602 and inductors 608 have no effect on the oscillator 600 because the resonator 602 provides a very high impedance relative to the rest of the oscillator 600, and inductors 608 act nearly as short circuits. In the state illustrated in FIG. 9A, the oscillator 600 is, effectively, a relaxation oscillator. In this state, the frequency of undesired relaxation oscillations in the oscillator 600 is determined by capacitors 622 and the input impedance of the gain stage, which is affected by feedback resistors 620, switched capacitors 614, and varactors 612.

Figure 9B:
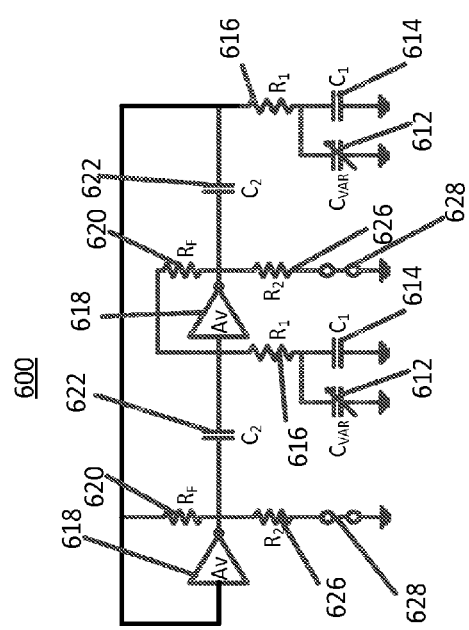

FIG. 9B shows a simplified diagram of the oscillator 600 of FIG. 6 at low frequencies where the resonator is approximated as an open-circuit, when HF_EN is enabled and the resistors 626 are connected to the oscillator 600. Again, the circuit 600 is in single-ended mode. This is a desired configuration when first commencing oscillations in the oscillator 600. The resistors 626 add an extra pair of pole and zero to form a high order high-pass filter with varactors 612, switched capacitors 614, and capacitors 622, and feedback resistor 620. The high-pass filter creates additional low frequency attenuation to suppress the gain at the relaxation frequency with negligible effect on high-frequency gain at the desired oscillation frequency. This inhibits relaxation oscillations from occurring in the oscillator 600. The resistors 626 need to be sufficiently small to suppress relaxation oscillation, but sufficiently large not to attenuate the main oscillations. If the high-pass filter is not turned on during start-up, unwanted relaxation oscillation can occur first. These parasitic oscillations can continue to exist at steady state operation. Depending on the gain at the desired oscillation frequency, the desired oscillation frequency may overcome the relaxation oscillation frequency, or the relaxation oscillation frequency may dominate to prevent the oscillations from reaching the desired frequency.

Figure 10:
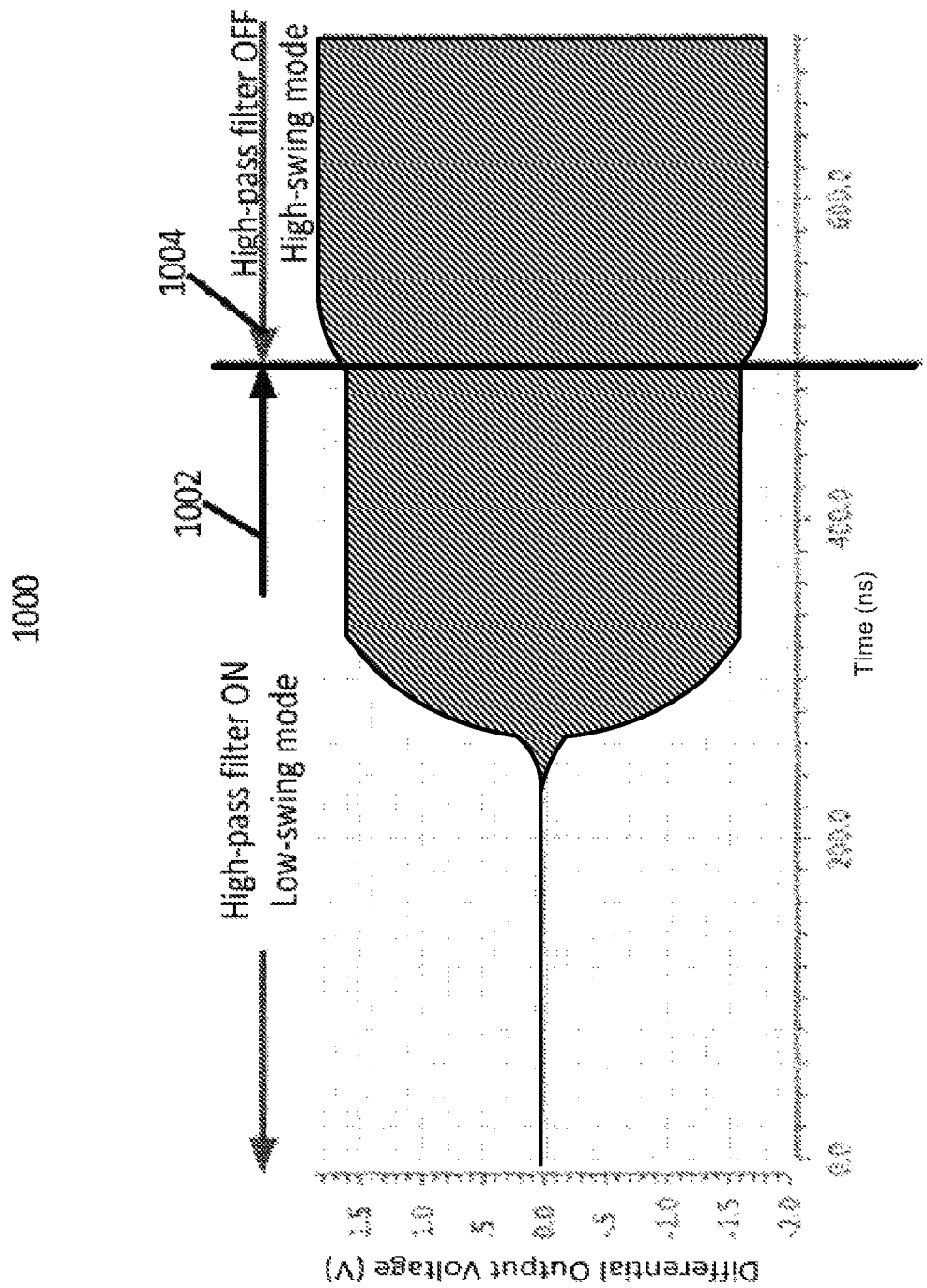
FIG. 10 shows a plot of oscillations created by the oscillator of FIG. 6.

FIG. 10 shows a plot 1000 of oscillations created by the oscillator 600 of FIG. 6. The y-axis shows the differential output voltage and the x-axis shows the time in nanoseconds. To inhibit relaxation oscillations from occurring, the oscillator 600 follows a start-up sequence. The high-pass filter is enabled when the gain stage is enabled. This causes the oscillator to enter "low-swing" mode 1002 so balanced oscillation will begin to accumulate in the oscillator. Once the oscillation stabilizes, the high-pass filter is disabled and the oscillator 600 enters "high-swing" mode 1004 for maximum phase noise performance. For low-end applications, the oscillator 600 may continue to operate in low-swing mode 1002 at steady state to reduce the start-up complexity and time, and remove the need for the switch 628. This assumes that the phase noise performance in the low-swing mode is sufficient for the target application.

Figures 11A, 11B, 11C:
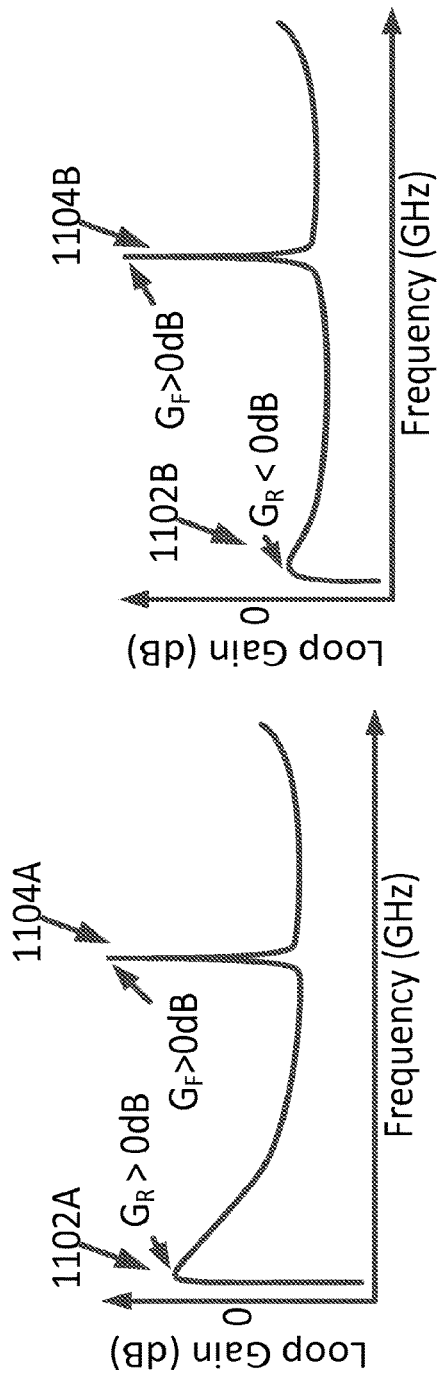
FIGS. 11A-C show the open loop gain in decibels (dB) versus frequency (GHz) for various configurations of the oscillator of FIG. 6.

FIGS. 11A-C show the open loop gain in decibels (dB) versus frequency (GHz) for various configurations of the oscillator 600 of FIG. 6 over time, including when commencing oscillations and a high-pass filter is disabled, (an undesired configuration), when the high-pass filter is enabled, and when oscillations have reached the desired frequency after the high-pass filter is disabled.

FIG. 11A shows a graph of the open loop gain versus frequency when commencing oscillation in the oscillator 600 as shown in FIG. 6 wherein the high-pass filter is disabled. Disabling the high-pass filter when commencing oscillations is an undesired configuration, and the resulting graph in FIG. 11A is for the purposes of explanation only. Since the loop gain $G_R$ at the relaxation frequency 1102A is higher than 0 dB or unity gain, it is possible for relaxation oscillations to start at this frequency, rather than for desired oscillations to start at the resonator frequency 1104A.

FIG. 11B shows the open loop gain as compared to oscillation frequency when commencing oscillations in the oscillator 600 of FIG. 6 wherein the high-pass filter is enabled. Enabling the high-pass filter when commencing oscillations is a desired configuration. Enabling the high-pass filter during start-up significantly reduces the gain $G_R$ at relaxation frequency 1102B to less than 0 dB or unity gain, which inhibits relaxation oscillations from occurring in the oscillator 600. Since the loop gain $G_F$ at the desired oscillation frequency 1104B ($G_F$) is the only point that is higher than 0 dB or unity gain, the oscillation will build up at the desired resonator frequency. Once the steady-state oscillation has been achieved at the desired frequency, the high-pass filter is turned off by the controller to transition the oscillator to high-swing mode and perform the gain ramp-up to boost the oscillator amplitude and achieve lower phase noise.

FIG. 11C shows the open loop gain as compared to oscillation frequency when oscillations have reached the desired frequency and wherein the high-pass filter is disabled. When oscillations reach large-signal steady-state at the desired frequency 1104C, the momentum of the oscillations (triggered in the high-Q electro-mechanical resonator) cause the oscillator to continue to run at the desired frequency 1104C and suppress other possible modes of oscillation. At large-signal steady state, the gain at frequency 1104C is settled to 0 dB or unity gain to sustain the oscillation. If the gain at frequency 1102C is less than 0 dB or unity gain, as depicted, then it is not possible for relaxation oscillations to occur.

Figure 12:
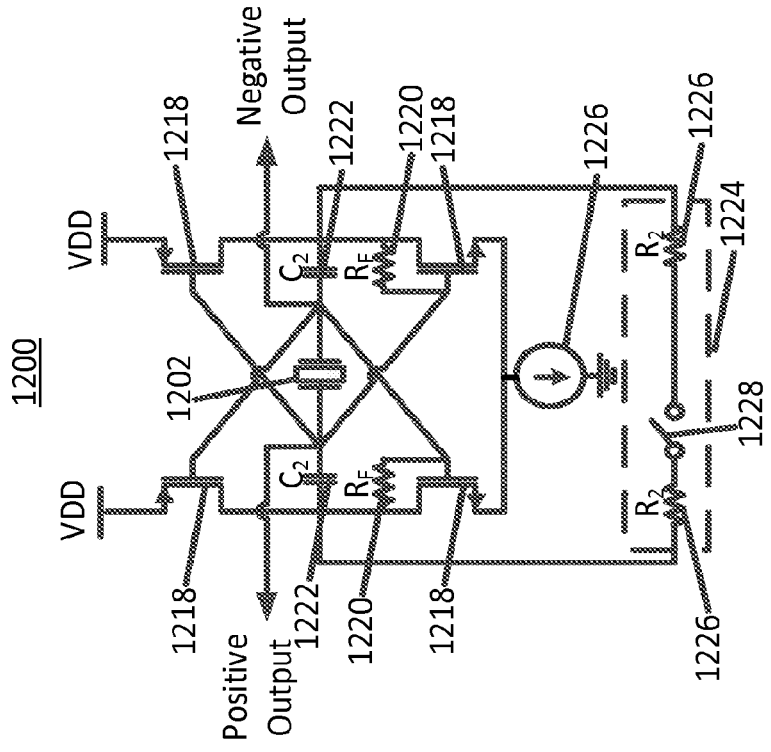
FIG. 12 shows an oscillator, similar to the oscillator of FIG. 6, in accordance with another embodiment of the present disclosure.

FIG. 12 shows an oscillator 1200, similar to the oscillator 600 of FIG. 6, in accordance with another embodiment of the present disclosure. The oscillator 1200 comprises an NMOS-based tail current source 1226 connected to the source of the NMOS transistors 1218. The tail current source 1226 helps to control or vary the amplitude of, and reduce phase noise in, the balanced oscillations in the oscillator 1200. Instead of, or in addition to, a tail current source 1226, one or more of a resistor, a variable resistor and an array of switchable (programmable) resistors can be used to control the amplitude and reduce phase noise in the balanced oscillations. A frequency tuning network, similar to the frequency tuning network 606 shown in FIG. 6 may be combined with the oscillator 1200 to permit tuning the frequency of the oscillations therein.

Figure 13:
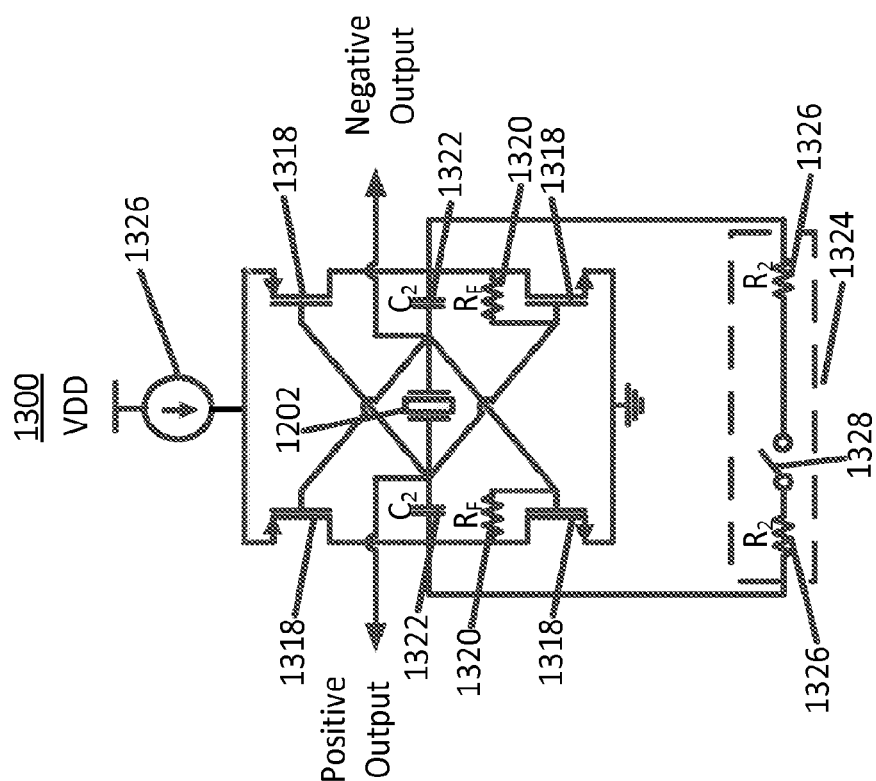
FIG. 13 shows an oscillator, similar to the oscillator of FIG. 6, in accordance with another embodiment of the present disclosure.

FIG. 13 shows an oscillator 1300, similar to the oscillator 600 of FIG. 6, in accordance with another embodiment of the present disclosure. The oscillator 1300 comprises a PMOS-based current source 1326 connected to the source of the PMOS transistors 1318. The current source 1326 is for varying the amplitude of, and reducing phase noise in, the balanced oscillations at a flicker noise region. Instead of, or in addition to, a tail current source 1326, one or more of a resistor, a variable resistor and an array of switchable (programmable) resistors can be connected to the source of the PMOS transistor for varying the amplitude of, and reducing phase noise in, the balanced oscillations. A frequency tuning network, similar to 606 shown in FIG. 6 may be combined with the oscillator 1300 to permit tuning the frequency of the oscillations in the oscillator 1300.

An electro-mechanical resonator can be modeled by a lumped RLC circuit. Both 2-port and 1-port models of the lumped RLC circuit can be used to describe the electrical behavior of the resonator. The 1-port model, which is more relevant to oscillator design, is known as Butterworth-Van-Dyke (BVD), or modified BVD (mBVD).

Figure 14:
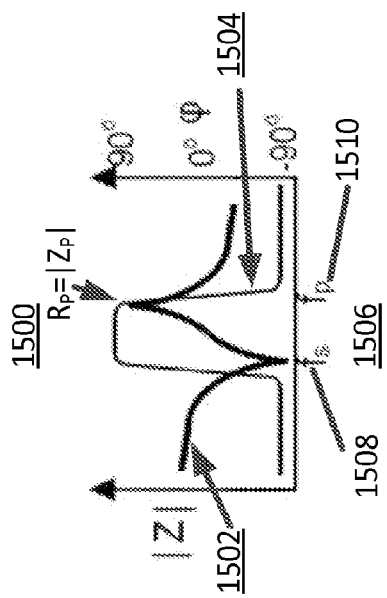
FIG. 14 shows a mBVD model of an electro-mechanical resonator.

FIG. 14 shows an mBVD model 1400 of an electro-mechanical resonator. For multi-gigahertz resonators, the inclusion of the resistances $R_s$, $R_m$, and $R_0$ is to accurately model the resonator losses at the high frequencies they can attain.

Figure 15:
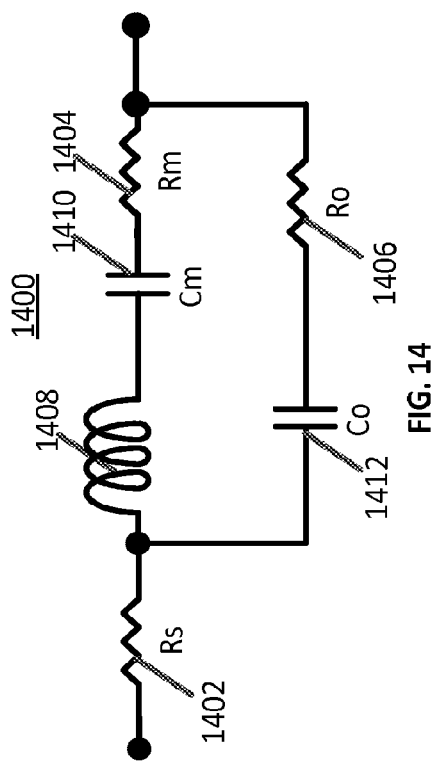
FIG. 15 shows a plot of the impedance magnitude and impedance phase of the modified Butterworth-Van-Dyke (mBVD) model of an electro-mechanical resonator over a range of frequencies.

FIG. 15 shows a plot 1500 of the impedance magnitude 1502 (|Z|), on a logarithmic scale, and impedance phase (φ) 1504, on a linear scale, of the mBVD model electro-mechanical resonator of FIG. 14 at various frequencies 1506. Below a series resonance frequency 1508 ($f_s$) and above a parallel resonance frequency also known as anti-resonance frequency 1510 ($f_p$), the resonator exhibits a capacitive behavior, or acts like a capacitor. At DC, the resonator is essentially an open-circuit. At resonance frequency $f_s$, the series $L_m$-$C_m$ motional branch acts nearly as a short and the resonator exhibits its lowest impedance, which has a purely real part ($R_m$) with no imaginary part. By comparison, when frequency f approaches infinity, the resonator impedance approaches zero, but the impedance has both real and imaginary parts. At $f_p$, the motional branch and the parallel branch co-resonate and the resonator exhibits its highest impedance, which is also purely real. Resistances 1402, 1404, and 1406 model the resonator 1400 losses. Between frequencies $f_s$ and $f_p$ the resonator exhibits an inductive behavior, or acts like an inductor where the impedance magnitude increase versus frequency. The working band of the resonator in a parallel mode oscillator is, accordingly, between $f_s$ and $f_p$. Therebetween, inductor $L_m$ 1408 dominates in the series branch and the resonator acts like an inductor with an effective inductance of $L_{eff}$, as shown in FIG. 15, the plot of which at various frequencies is shown in FIG. 17.

The frequency response shown in FIG. 15 is in logarithmic scale. It shows a significant change in impedance levels on plot 1502 over a narrow frequency band between frequencies $f_s$ 1508 and $f_p$ 1510, from the absolute minimum to maximum. For example, a typical value of the minimum impedance magnitude at frequency $f_s$ is approximately 1 to 2 ohms and a typical maximum impedance magnitude at frequency $f_p$ is approximately 2 kilo ohms to 6 kilo ohms for a multi-gigahertz FBAR/BAW resonator.

Because the resonator 1400 is only inductive between frequencies $f_s$ and $f_p$, the bandwidth or distance between frequencies $f_s$ and $f_p$ is, effectively, the frequency tuning range of the oscillator 1400. The frequency tuning range (FTR) of a resonator is defined by the formula ($f_p$−$f_s$)/$f_s$. Effective coupling ratio $k_{eff}^2$ is related to the FTR, and is defined by the formula $k_{eff}^2=(f_p^2-f_s^2)/f_s^2$. The larger the desired FTR, the higher the $k_{eff}^2$ required for the resonator.

FBAR/BAW type resonators have a $k_{eff}^2$ equal to around 4%-6%, which is why such piezoelectric resonators are most suitable for narrowband applications. In between $f_s$ and $f_p$ frequencies, the mBVD model of the resonator 1400 can be simplified to an effective inductance, as well as an effective series resistance that determines the resonance quality factor Q.

Figure 16:
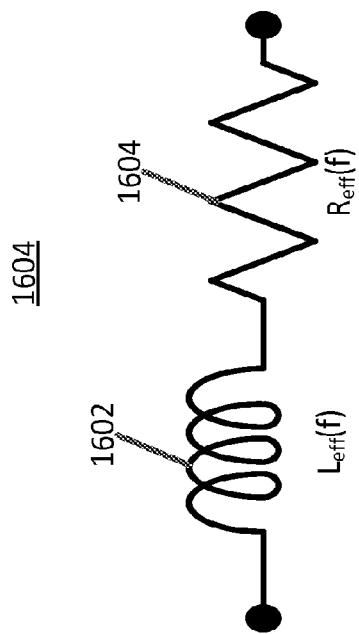
FIG. 16 shows a simplified circuit diagram of the mBVD model of FIG. 14.

FIG. 16 shows a simplified circuit diagram 1600 of the mBVD model 1400 of FIG. 14 when operating between $f_s$ and $f_p$. The effective inductance $L_{eff}$(f) 1602 is in series with the effective resistance $R_{eff}$(f) 1604 where f is the frequency variable. Above $f_s$, the inductance from inductor $L_m$ 1408 dominates in the series branch and the resonator 1400 exhibits an inductive behavior, or acts like an inductor. At frequency $f_p$, the series branch impedance resonates with the parallel capacitor $C_o$ 1412 branch, hence the resonator 1400 reaches its highest impedance. The working band of the resonator 1400 in parallel with the oscillator is therefore between $f_s$ and $f_p$.

Figure 17A:
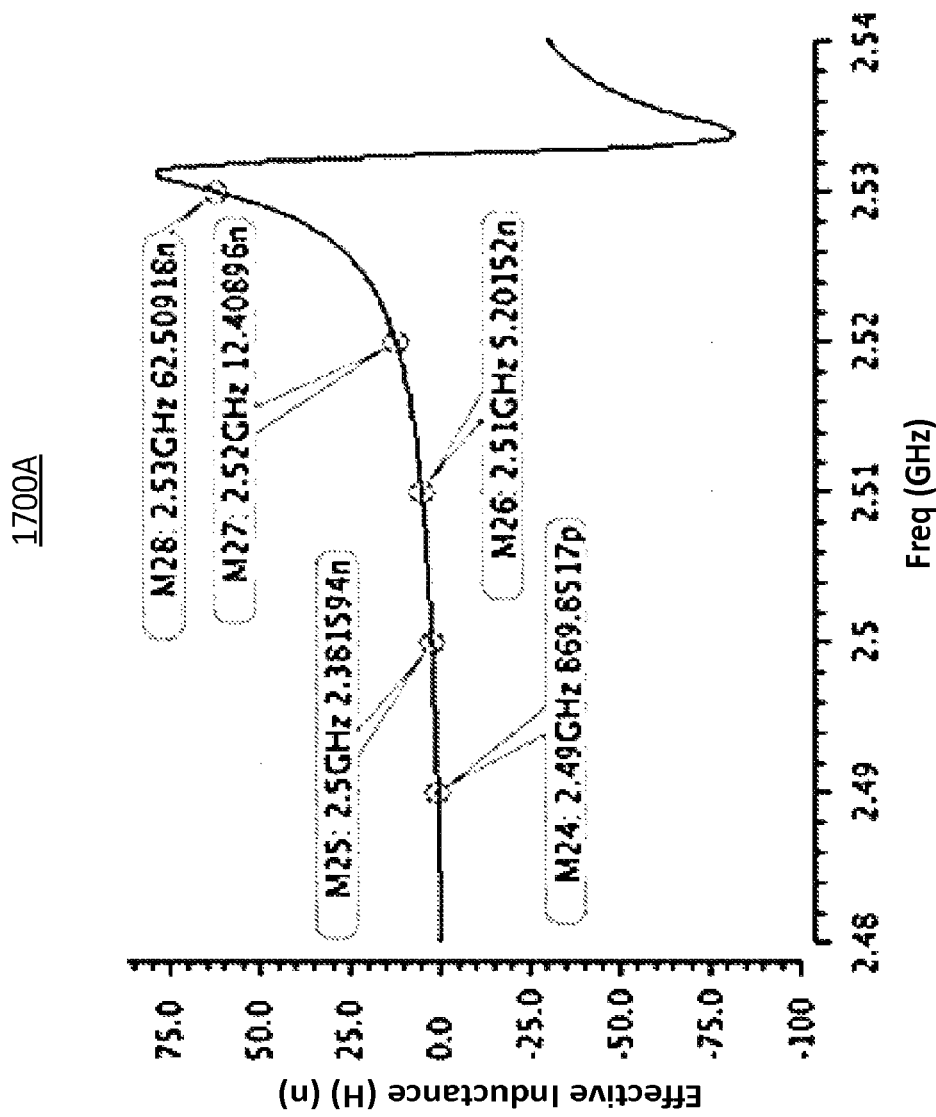
FIGS. 17A and 17B show example plots of the effective inductance of a resonator similar to the resonator shown in FIG. 14 in an oscillator similar to the oscillator of FIG. 6.
Figure 17B:
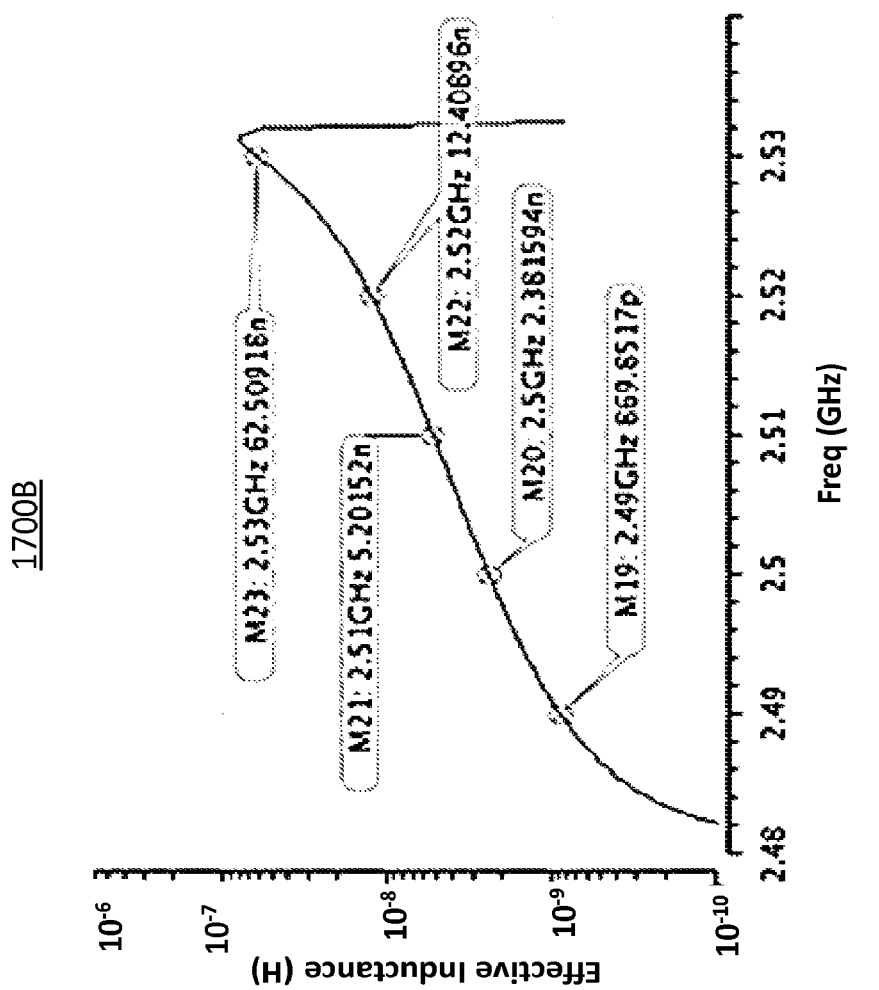

FIGS. 17A and 17B show example plots of the effective inductance of the mBVD model 1400 of a resonator shown in FIG. 14, in an oscillator similar to the oscillator 600 of FIG. 6, but without inductors L1 608, across a range of frequencies on a normal 1700A and logarithmic scale 1700B, respectively. As shown, the effective inductance changes significantly across the working range of frequencies. The oscillation frequency $f_o$ is determined by the amount of capacitance resonating with the effective inductance $L_{eff}$ of the resonator, and can be described by the equation $$f_0 = \frac{1}{2\pi\sqrt{L_{eff} C_{total}}}.$$

The effective inductance of the resonator increases at a rate that is greater than a linear rate with frequency. Between the frequencies $f_s$ and $f_p$, the effective inductance $L_{eff}$ can be approximated by the equation $\log^{(L_{eff})} \sim kf+n_o$, where k and $n_o$ are constants. The capacitance required for oscillation at a particular frequency is then derived according to the proportional relationship $$C \propto \frac{1}{f^2 10^{kf}}.$$

This relationship essentially implies that to linearly change the frequency of the oscillations in the oscillator, a greater than linear change in capacitance in the oscillator's resonant tank is required.

Greater changes in capacitance, however, require a larger capacitor to facilitate a large relative change in capacitance ($C_{MAX}/C_{MIN}$ ratio), which would in turn lead to a larger semiconductor die area and, potentially, a larger IC package size. Accordingly, it is desirable to keep the maximum amount of capacitance required to a minimum. This can be difficult to do, however, because of parasitic capacitance, which is always present in the oscillator, and imperfect switches for controlling the capacitor bank. Large capacitors require large (low-resistance) electronic switches to connect the capacitance to the circuit, and this relationship is fixed in order to maintain a good Q factor. This, however, makes it difficult to get a large relative change in capacitance ($C_{MAX}/C_{MIN}$ ratio) to tune the frequency of the oscillator since the larger the switch, the greater the parasitic capacitance, and this would increase $C_{MIN}$ in the denominator. As such, the large parasitic capacitance restricts the $C_{MAX}/C_{MIN}$ ratio of the switchable capacitor, thereby limiting the frequency tuning range. Although varactors are not necessarily switched, their implementation results in inherent parasitic capacitance and signal coupling.

FIG. 18 shows a capacitor bank 1800 comprising varactors 1802 and switched capacitors 1804 similar to the varactors 612 and switched capacitors 614 of oscillator 600 of FIG. 6, respectively. The varactors 1802 and switched capacitors 1804 are arranged in parallel with one another. The switched capacitors 1804 are enabled or connected by electronic switches 1806. The switched capacitors 1804 may be metal-oxide-metal (MoM) or metal-insulator-metal (MiM) capacitors or any other types of fixed capacitors.

FIG. 19 shows a representation of an individual branch 1900 of the switchable capacitor 1804 of FIG. 18. Capacitors $C_{Bi1}$ 1902 is the top plate parasitics of the switchable capacitor 1804, and capacitors $C_{Bi2}$ 1904 is the bottom plate parasitic capacitance including other parasitic capacitances from the switch 1806. The switch itself has a small ON resistance (not shown). When the switch 1906 is closed, the branch capacitance is close to $C_{Mi}/2$, where $C_{Mi}$ 1908 is the main switchable capacitance element. But when the switch 1806 is open, instead of having an open circuit, the branch has an OFF capacitance of $$\left( \frac{C_{Mi} C_{Bi2}}{C_{Mi} + C_{Bi2}} + C_{Bi1} \right)/2.$$

Bound by practical physical implementation properties, the parasitic capacitances $C_{Bi1}$, 1902 and $C_{Bi2}$ 1904 are proportional to a fraction of $C_{Mi}$ 1908 and set a maximum bound on the max-to-min capacitance ratio of the capacitor bank 1800.

As an example, in a typical 65 nm CMOS technology, a max-to-min capacitance ratio of 6-to-1, with an acceptable Q in high-performance oscillator applications, can be achieved with switchable MoM capacitors. Although this ratio is usually acceptable in LC oscillator applications, it is in most practical cases too low for tuning electro-mechanical resonators and it would limit the amount by which the frequency of these oscillators could be tuned. A large tuning range is desired to compensate for resonator's trim accuracy, aging-induced frequency drift, and temperature-induced frequency drift.

As described above in relation to FIGS. 14 to 16, to change the frequency of oscillations by a linear amount in an oscillator comprising an electro-mechanical resonator, the amount of capacitance in the tuning network must be changed or varied by a rate that is greater than a linear amount. Parasitic capacitances in the oscillator define the minimum or fixed capacitance amount. Parasitic capacitance may be contributed. If there is a high fixed parasitic capacitance in the oscillator, larger capacitors whose capacitance can be controlled must be placed in the frequency tuning network to provide a higher maximum capacitance to widen the frequency tuning range. Larger capacitors, however, require larger switches to vary (digitally turn on/off) the capacitance to maintain a good LC quality factor in the oscillator. But large switches results in even greater parasitic fixed capacitance which further necessitates larger capacitors. The tuning range of oscillators is determined by the ratio of fixed (minimum) capacitance to total capacitance. Accordingly, the large fixed capacitance from the large capacitor switches restricts the tuning range. Increasing the size of capacitors in the frequency tuning network, along with an associated non-ideal switch to turn the capacitors on/off, however, degrades the phase noise quality of the oscillations. Accordingly, there is a trade-off between the frequency tuning range of the oscillator on the one hand, and the phase noise quality of the oscillations on the other hand, as dictated by the amount of capacitance (size of the capacitors) in the frequency tuning network.

The tuning range of the oscillator is determined by the effective change in capacitance seen by the resonator at its terminals. Accordingly, in accordance with an example embodiment of the present disclosure, inductors are placed in series between the terminals of the resonator and the frequency tuning network as shown in oscillator 600 of FIG. 6. The inductors 608 increase or amplify the maximum effective capacitance seen by the resonator above the amount that is actually in the tuning network. In other words, the amount of capacitance in the tuning network remains the same, but the effective capacitance that can be observed by the resonator is increased. This increases the frequency tuning range of the oscillator without requiring larger capacitors in the frequency tuning network.

Referring again to FIG. 6, the frequency tuning network 606 comprises two inductors $L_1$ 608, each inductor 608 connected in series with the resonator 602, and varactors 612 and switchable capacitors 614 connected in parallel. The inductors 608 help extend the tuning range of the oscillator 600. The effective inductance of the resonator 602 in series with inductors 608 is described by the equation $L_{eff\_new}=2L_1+L_{eff}$, where $L_{eff\_new}$ is the effective inductance of the standalone resonator, and $L_{eff\_new}$ is the new effective inductance of the resonator together with the inductors $L_1$ in series.

Figure 20:
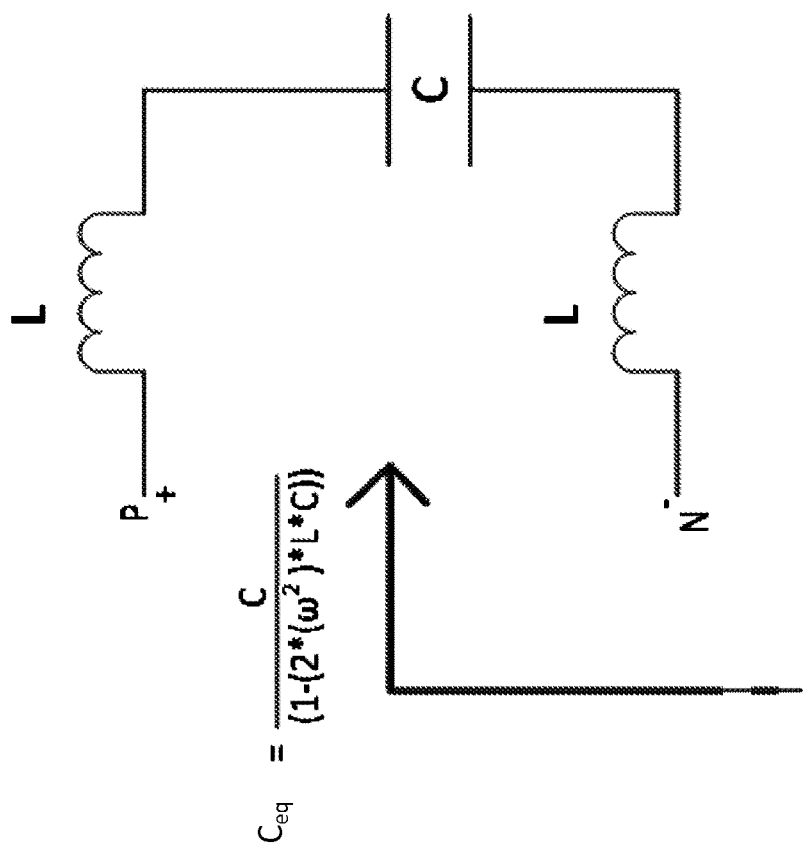
FIG. 20 shows a simplified circuit diagram of a load as seen from the terminals P(+) and N(−) of a resonator.

FIG. 20 shows a simplified circuit diagram of a load (modeled by a capacitor C in series with two inductors L) such as a tuning network as seen from terminals P(+) and N(−) of a resonator. The effective capacitance $C_{eq}$ seen by the resonator at its terminals P(+) and N(−) is described by the equation $$C_{eq} = \frac{C}{(1 - (2\omega^2 LC)},$$

where $\omega = 2\pi f$ is the angular frequency (Hertz) in radians per second. The effective differential load impedance $Z_{eq}$ seen from the resonator at its terminals is, accordingly, described by the equation $$Z_{eq} = \frac{1}{sC} + 2sL,$$

which can be re-written as $$Z_{eq} = \frac{1}{sC_{eq}} = \frac{1 + 2s^2 LC}{sC}$$

where $s=j\omega$ is the Laplace Transform variable, and $C_{eq}$ is the equivalent or effective capacitance, and L is the series inductance representing the inductors $L_1$ 608 shown in FIG. 6. Replacing s with $j\omega$ results in the equation becoming:

$$\frac{1}{j\omega C_{eq}} = \frac{1 - 2\omega^2 LC}{j\omega C}.$$

Accordingly, the final equation for effective capacitance is $$C_{eq} = \frac{C}{1 - 2\omega^2 LC}.$$

A carefully-chosen inductor L value for a corresponding capacitor C value will cause the denominator to be less than 1. This will cause the effective capacitance seen by the resonator to be larger than the physical capacitance C by an amplification factor equal to $$\frac{1}{1 - 2\omega^2 LC}.$$

Figures 21, 22:
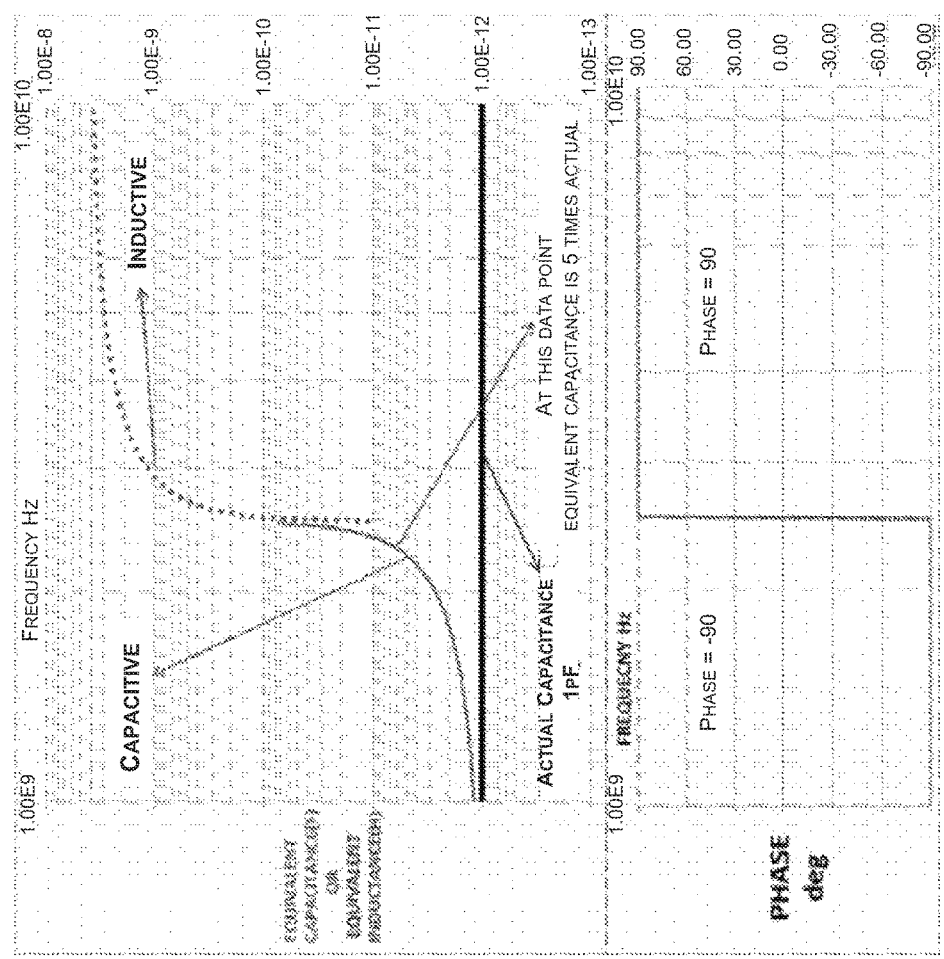
FIG. 21 shows a plot comparing the effective capacitance vs. frequency as seen by a resonator at its terminals when connected to the LC structure of FIG. 20.
FIG. 22 shows a plot comparing the phase in degrees vs. frequency in Hertz as seen by a resonator at its terminals when connected to the LC structure of FIG. 20.

FIG. 21 shows a plot comparing the effective capacitance vs. frequency as seen by a resonator at its terminals when connected to the LC structure of FIG. 20. This plot shows that the structure comprising a capacitor in series with two inductors L behaves like an inductance beyond the series resonance frequency of $$\frac{1}{2\pi\sqrt{2LC}},$$

corresponding to 2L and C, and that by carefully selecting the series inductor value one can take advantage of the capacitance amplification property. The series inductance values are selected based on the operating frequency as well as the main capacitance to be amplified. A five-times (5×) amplification in capacitance can be achieved in practice, thereby reducing the corresponding silicon implementation area by a factor of five. The equivalent circuit can behave like an inductance beyond the series resonance frequency of 2L and C. Accordingly, the inductance value is selected to keep the said resonance frequency away from the electromechanical resonator's resonance frequency.

FIG. 22 shows a plot comparing the phase in degrees vs. frequency in Hertz as seen by a resonator at its terminals when connected to the LC structure of FIG. 20.

Figure 23A:
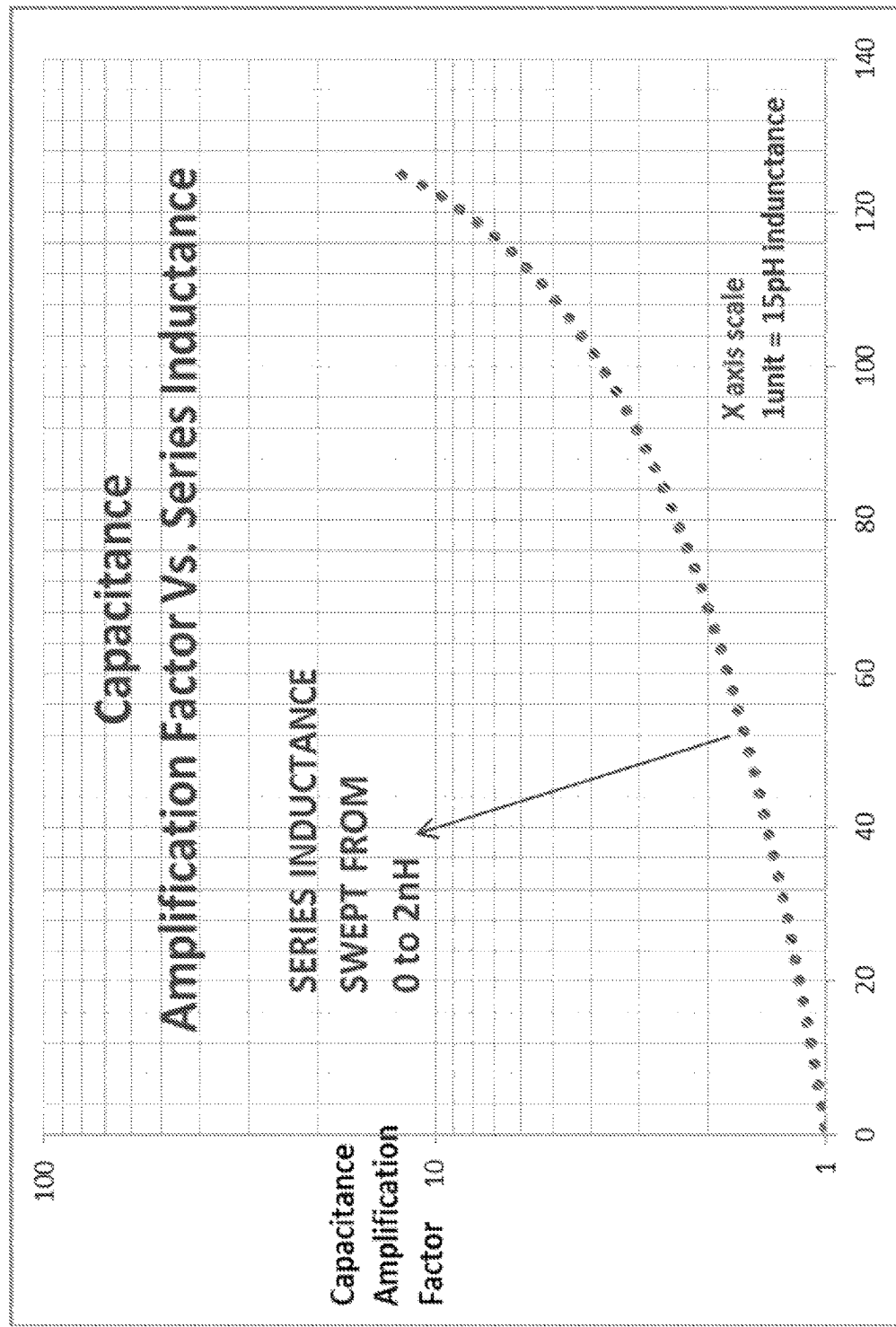
FIG. 23A shows a plot comparing the capacitance amplification factor versus series inductance as seen by a resonator at its terminals when connected to the LC structure of FIG. 20.

FIG. 23A shows a plot comparing the capacitance amplification factor $$\left(\frac{1}{1 - 2\omega^2 LC}\right)$$

versus series inductance as seen by a resonator at its terminals when connected to the LC structure of FIG. 20.

Figure 23B:
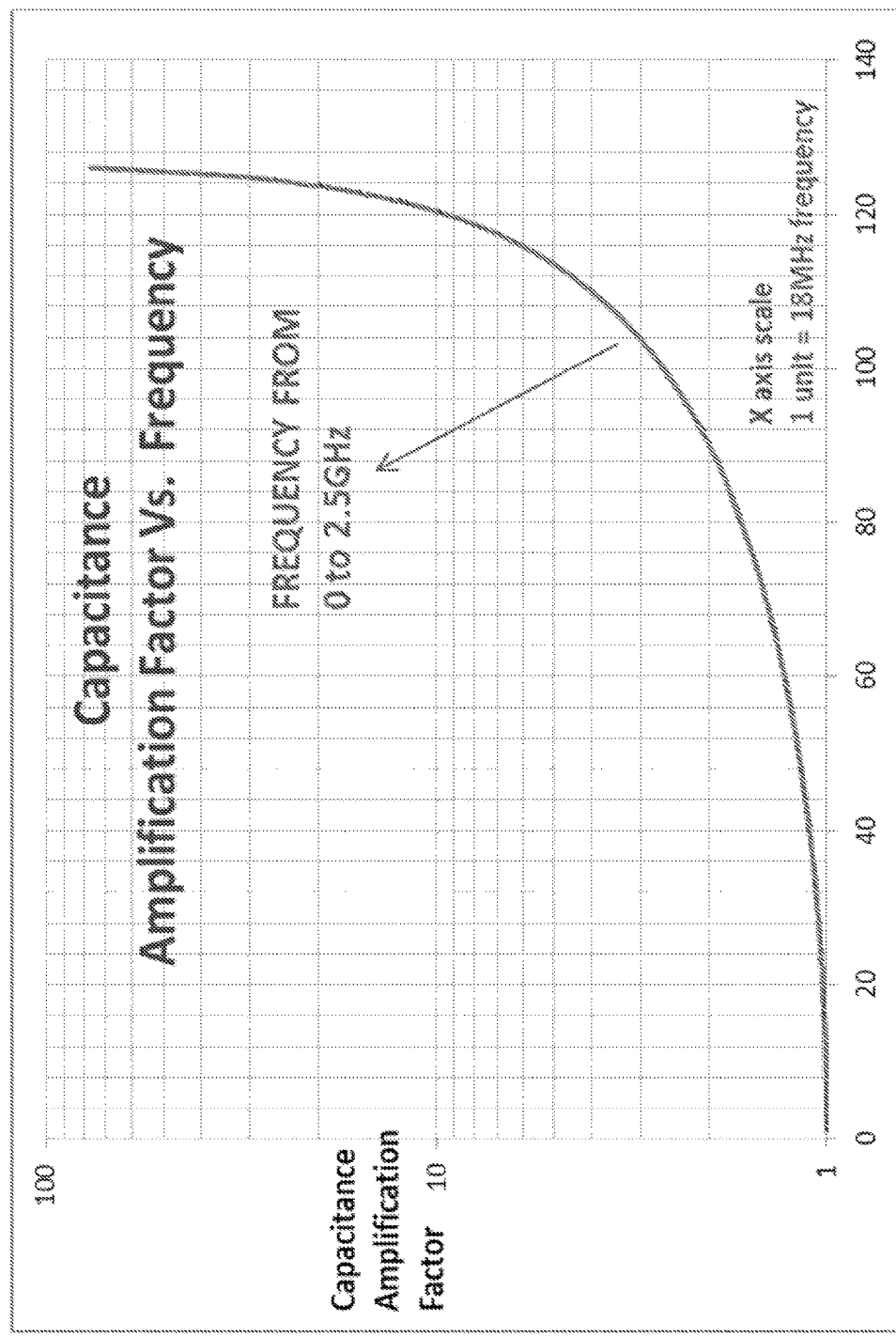
FIG. 23B shows a plot comparing the capacitance amplification factor versus frequency as seen by a resonator at its terminals when connected to the LC structure of FIG. 20.

FIG. 23B show a plot comparing the capacitance amplification factor $$\left(\frac{1}{1 - 2\omega^2 LC}\right)$$

versus frequency as seen by a resonator at its terminals when connected to the LC structure of FIG. 20.

As shown in FIG. 21, the fixed inductance 2L reduces the logarithmic slope of the effective inductance plot shown in FIG. 17B by significantly increasing the inductance at low end oscillations frequencies near $f_s$. This makes the resonator tank less dependent on the inverse near-exponential change in capacitance required to achieve a linear change in frequency. The amount of inductance is selected based on the operating frequency of the oscillator and the capacitance to be amplified. The overall capacitance C required for resonant oscillation at f with the resonator plus 2L can be described by the proportional relationship $$\propto \frac{1}{f^2(2L_1 + 10^{kf+n_0})},$$

where f is frequency, and k and $n_o$ are constants.

The required capacitance ratio between the oscillator 600 with inductors $L_1$ 608 and the oscillator without the inductors can be described by the equation $$\frac{C_{withL1}}{C_{withoutL1}} = \frac{10^{kf+n_0}}{2L_1 + 10^{kf+n_0}}.$$

At higher oscillation frequencies near $f_p$, where the capacitance of the oscillator 600 is set at a minimum, the amount of capacitance $C_{MIN}$ needed is roughly the same with or without the inductors $L_1$ 608, and the above ratio is close to 1. At a lower oscillation frequency near $f_s$, however, where the capacitance of the oscillator 600 is set at a maximum, the amount of capacitance $C_{MAX}$ needed to achieve a particular frequency is reduced by virtue of capacitance amplification due to adding the inductors $L_1$ 608, as compared to the oscillator without the inductors. Accordingly, this reduces the max-to-min capacitance ratio ($C_{MAX}/C_{MIN}$) needed to cover the same oscillation frequency tuning range. In other words, the inductors help achieve a desired tuning range for the oscillator 600, but with a smaller on-to-off capacitance ratio.

Referring again to the example discussed in relation to FIG. 17B, a capacitance of 4697 fF is required for the oscillator 600 to create oscillations at a frequency of 2.49 GHz, and a capacitance of 773 fF is required to create oscillations at a frequency of 2.51 GHz. If the oscillator core 604 has a fixed parasitic capacitance of 200 fF, the capacitor bank 612, 614 would require a maximum capacitance of 4497 fF and a minimum capacitance of 573 fF. The max-to-min capacitance ratio would, accordingly, be 7.8, which is difficult to reliably implement in a standard CMOS 65 nm technology due to process variations and unavoidable parasitic capacitances.

Figure 24:
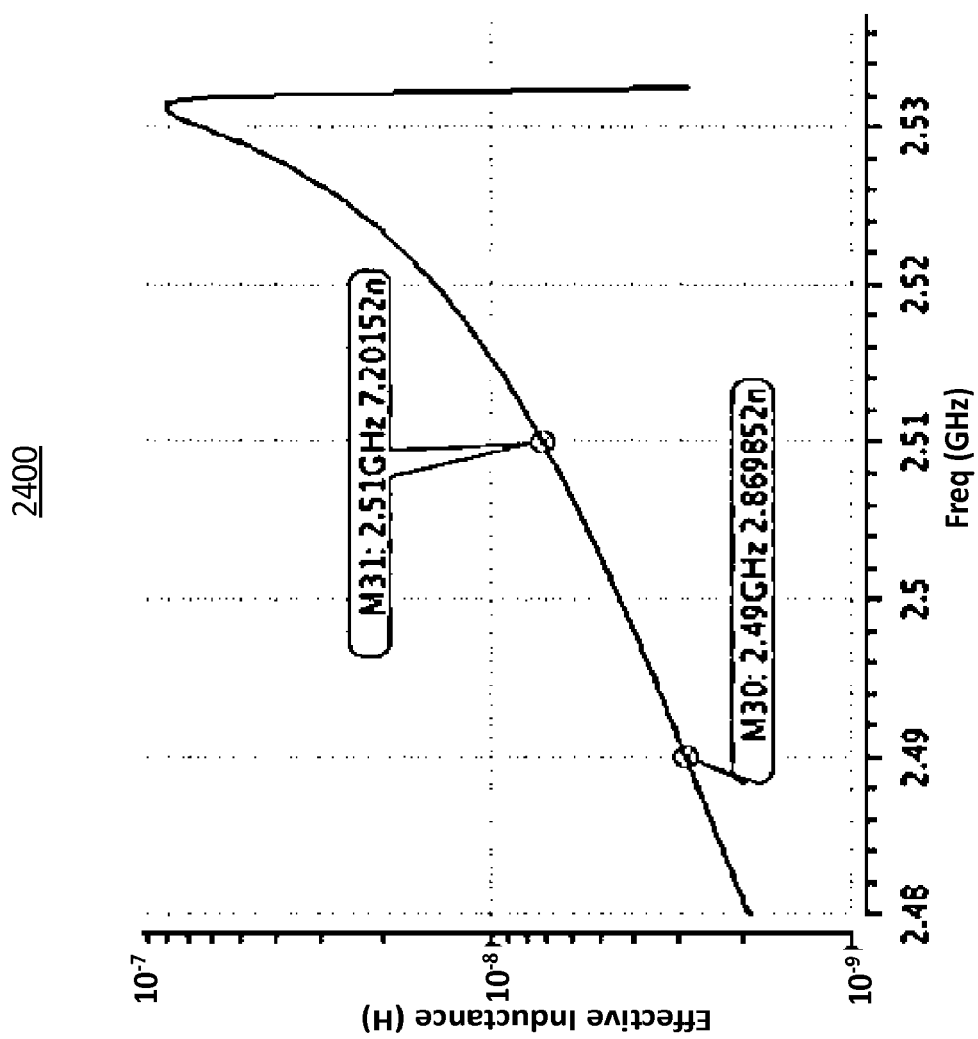
FIG. 24 shows a plot of effective inductance versus frequency of an electro-mechanical resonator in an oscillator.

FIG. 24 shows a logarithmic plot 2400 of effective inductance of the resonator versus frequency for an oscillator similar to the resonator and oscillator used to obtain the plot in FIG. 17B, the difference being the oscillator comprises two inductors $L_1$ each having an inductance value of 1 nH, in series with the resonator. The capacitance required to oscillate at 2.49 GHz is 1424 fF and at 2.51 GHz is 558 fF. If the fixed parasitic capacitance is 200 fF, the capacitor bank would need a maximum capacitance of 1224 fF and a minimum capacitance of 358 fF, hence a max-to-min ratio of only 3.4. Not only is this capacitance ratio more easily implemented in the earlier described 65 nm CMOS technology, but the total amount of capacitance needed has also dropped from 4497 fF to 1424 fF, which can significantly reduce die area and cost to implement the tank capacitor.

Figure 25B:
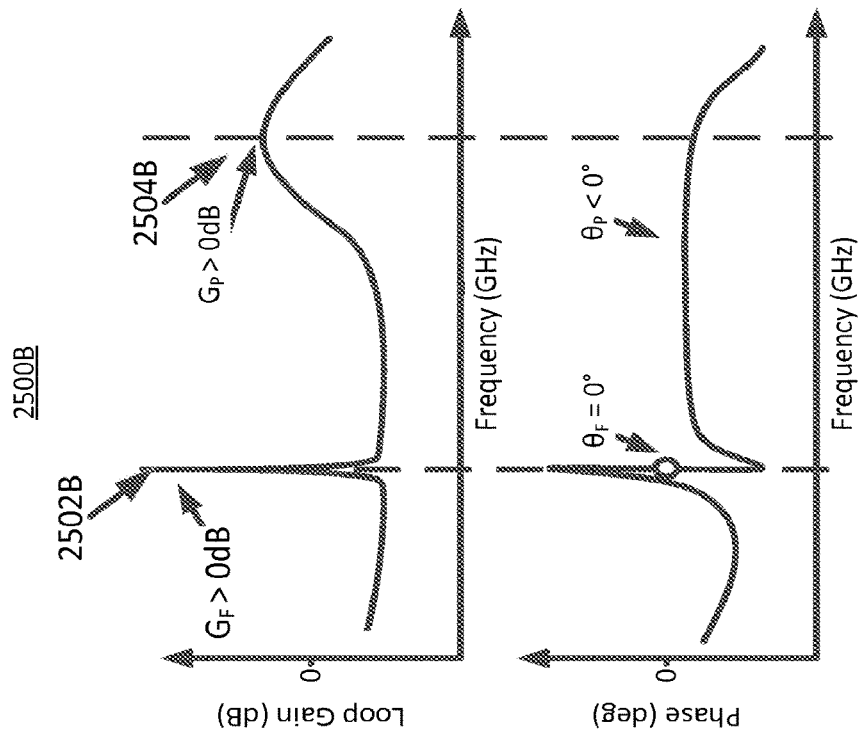
FIGS. 25A and 25B show plots of loop gain and phase for a range of frequencies for an oscillator similar to the oscillator of FIG. 6.
Figure 25A:
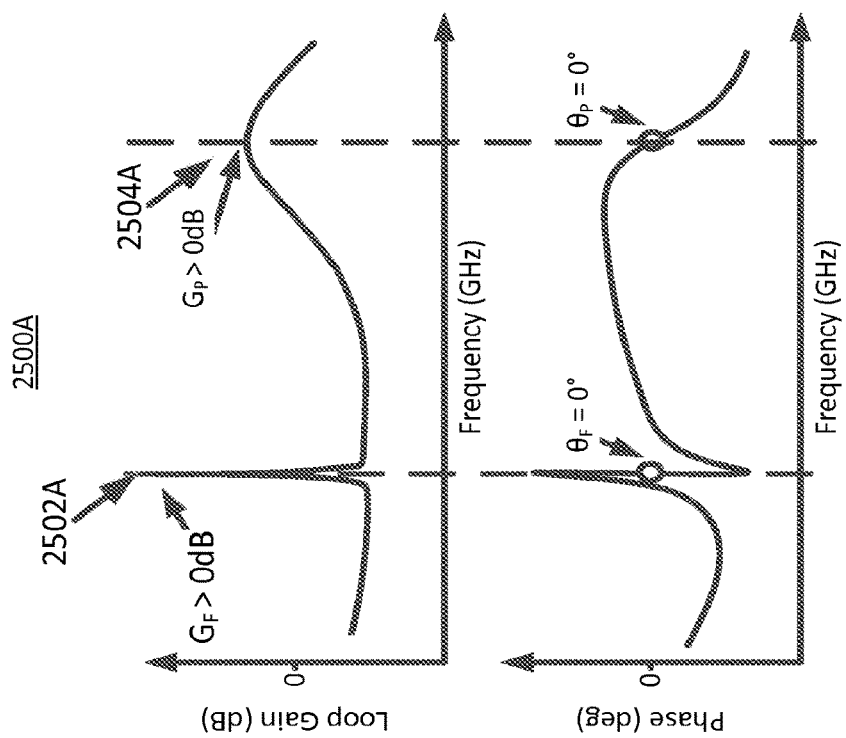

FIG. 25A shows a plot 2500A of the open loop gain in decibels (dB) and phase in degrees for a range of frequencies, for an oscillator similar to the oscillator of FIG. 6 at start-up, but without resistors R1 616. At very high frequencies well above $f_p$, the inductors $L_1$ 608 may introduce a secondary series resonance in the oscillator 600. This is because at frequencies above $f_p$, the resonator 602 exhibits a capacitive behavior, with the capacitance value close to $C_o$ 1412 of the mBVD model 1400 of FIG. 14. This forms a series resonance 2504A with the inductors $L_1$ 608. If the oscillator's open loop gain $G_P$ at the frequency corresponding to parasitic resonance 2504A is higher than 0 dB, or unity gain, when the phase $\theta_p$ is equal to 0 degrees, the loop can begin oscillating in this parasitic mode.

FIG. 25B shows a plot of the loop gain in decibels (dB) and phase in degrees for a range of frequencies, for an oscillator similar to the oscillator of FIG. 6 at start-up, including resistors R1 616. Adding the resistors $R_1$ 616 increases the phase delay at high frequencies to prevent $\theta_p$ from crossing the 0° point, where $G_P$ can be higher than 0 dB. Because Barkhausen criterion for an oscillation to start requires that both θ=0° and G>0 dB, the low-pass filtering action in the phase domain from $R_1$ 616 helps prevent any oscillation from occurring at this secondary parasitic frequency. As a result, the gain and phase of the loop, $G_F$ and $\theta_F$, for the main oscillation frequency 2502B are virtually unaffected, while $\theta_p$ is always kept less than 0° beyond the main oscillation frequency 2502B, including at the secondary parasitic frequency 2504B.

Figure 26:
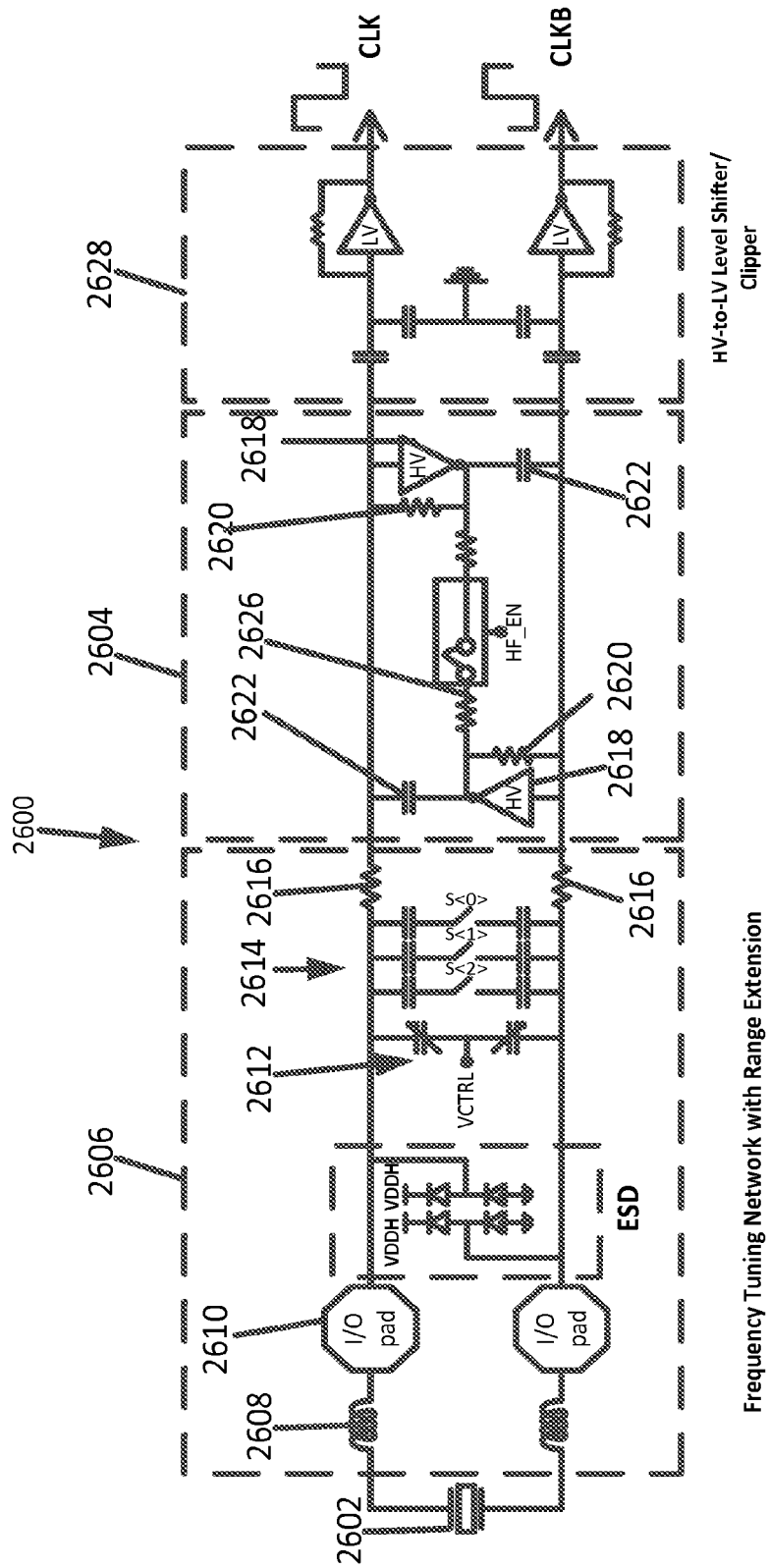
FIG. 26 shows another embodiment of an oscillator in accordance with the present disclosure.

FIG. 26 shows another embodiment of an oscillator 2600 in accordance with the present disclosure. The oscillator 2600 is similar to the oscillator 600 of FIG. 6, the difference being the oscillator 2600 comprises a level shifter 2628 connected to the oscillator driver 2604 to level shift the oscillator output signal from a high-voltage (e.g., 2.5V) rail to a low-voltage (e.g., 1.0V) rail. A level shifter 2628 is also known as a hard-limiting amplifier. The embodiment of the oscillator 2600 shown in FIG. 26 produces a square-wave digital signal. The oscillator 2600 may be used in, for example, a high performance clock synthesizer (local oscillator, or LO) with an integrated jitter attenuator (JAT) PLL that generates low-jitter, low-phase-noise clock outputs for driving high performance data converters, RF synthesizers, serializer-deserializer (SERDES) interfaces, and digital signal processing (DSP) subsystems. The oscillator driver 2604 may be fabricated in 65 nm CMOS process using 1-Volt and internal regulated 2.5-Volt power supplies, and Deep-NWell option for noise isolation. Rather than a level shifter 2628, the oscillator 2600 can comprise a band-pass or a tuned amplifier for generating a sinusoidal signal.

Figures 27, 28:
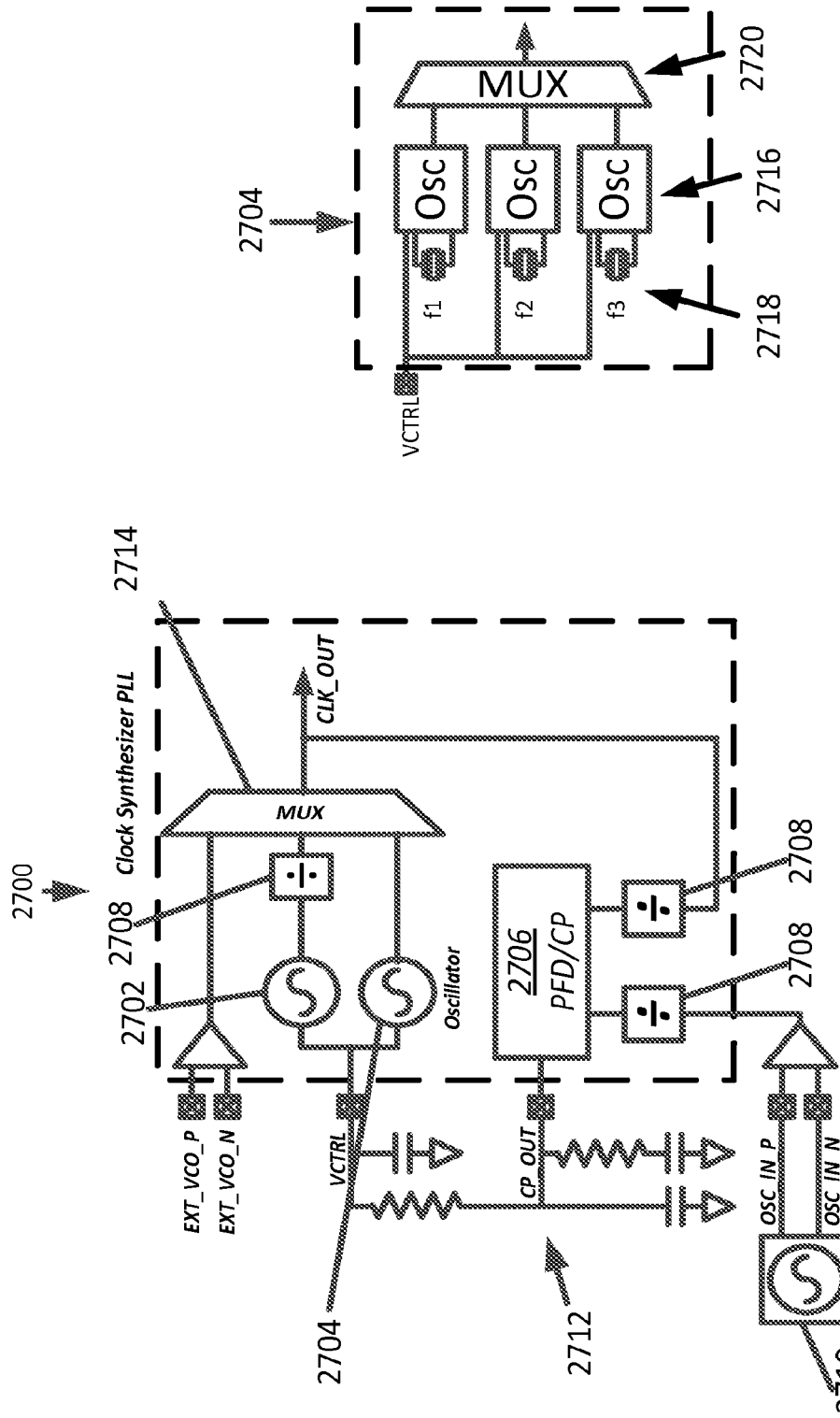
FIG. 27 shows a clock synthesizer phase-locked loop (PLL) comprising a voltage controlled oscillator in accordance with an embodiment of the present disclosure.
FIG. 28 shows a detailed view of a voltage controlled oscillator array of FIG. 27.

FIG. 27 shows a clock synthesizer phase-locked loop 2700 (PLL) comprising first 2702 and second 2704 voltage-controlled oscillators. The PLL 2700 also comprises a phase-frequency detector and charge pump 2706 (PFD/CP) and clock dividers 2708. The PLL 2700 receives a reference clock signal from a crystal oscillator XO 2710. The PLL 2700 divides the reference clock signal and compares its phase and frequency to the divided-down output signal CLK_OUT using the PFD/CP 2706. A difference in the phase or frequency generates an output charge-pump signal CP_OUT. The output signal from the PFD/CP 2706 is received by a loop filter 2712. The loop filter 2712 generates a control voltage signal VCTRL. The control voltage signal VCTRL passes into the VCOs 2702, 2704. The first VCO 2702 can be a conventional VCO with an integrated LC resonator followed by a frequency divider. For applications that do not require an ultra low phase noise clock signal, a divided down signal from the first VCO 2702 is selected using a multiplexor 2714. For applications requiring a clock signal with ultra low phase noise performance, the second VCO 2704, which is electro-mechanical based, is selected using the multiplexor 2714. The output signal CLK_OUT from the multiplexor 2714 is the clock signal.

FIG. 28 shows, in greater detail, the second voltage controlled oscillator 2704 of FIG. 27. The voltage controlled oscillator 2704 comprises three tunable electro-mechanical balanced oscillators 2716 in accordance with an embodiment of the present disclosure. In another embodiment, there is a bank of selectable oscillators some of which may be tunable. Each oscillator 2716 comprises an electro-mechanical resonator 2718 centered at a different oscillation frequency f1, f2, f3. The resonators 2718 are BAW or FBAR in miniature hermetic packages incorporated in a flip-chip (FC) or wire-bond (WB) package of the clock synthesizer integrated circuit. The oscillators are connected to a multiplexor 2720, which selects which of the oscillator signals is propagated to an output. The oscillator 2716 with the most suitable frequency for the application and output frequency is selected.

Referring again to FIG. 27, the control voltage signal VCTRL continuously tunes the frequency of the selected oscillator 2702, 2704 so that a precise output frequency is generated that is unaffected by voltage and temperature drifts. The fixed capacitance in the capacitor bank is adjusted in the IC production to offset the trimming inaccuracy of the resonators 2718.

Figure 29:
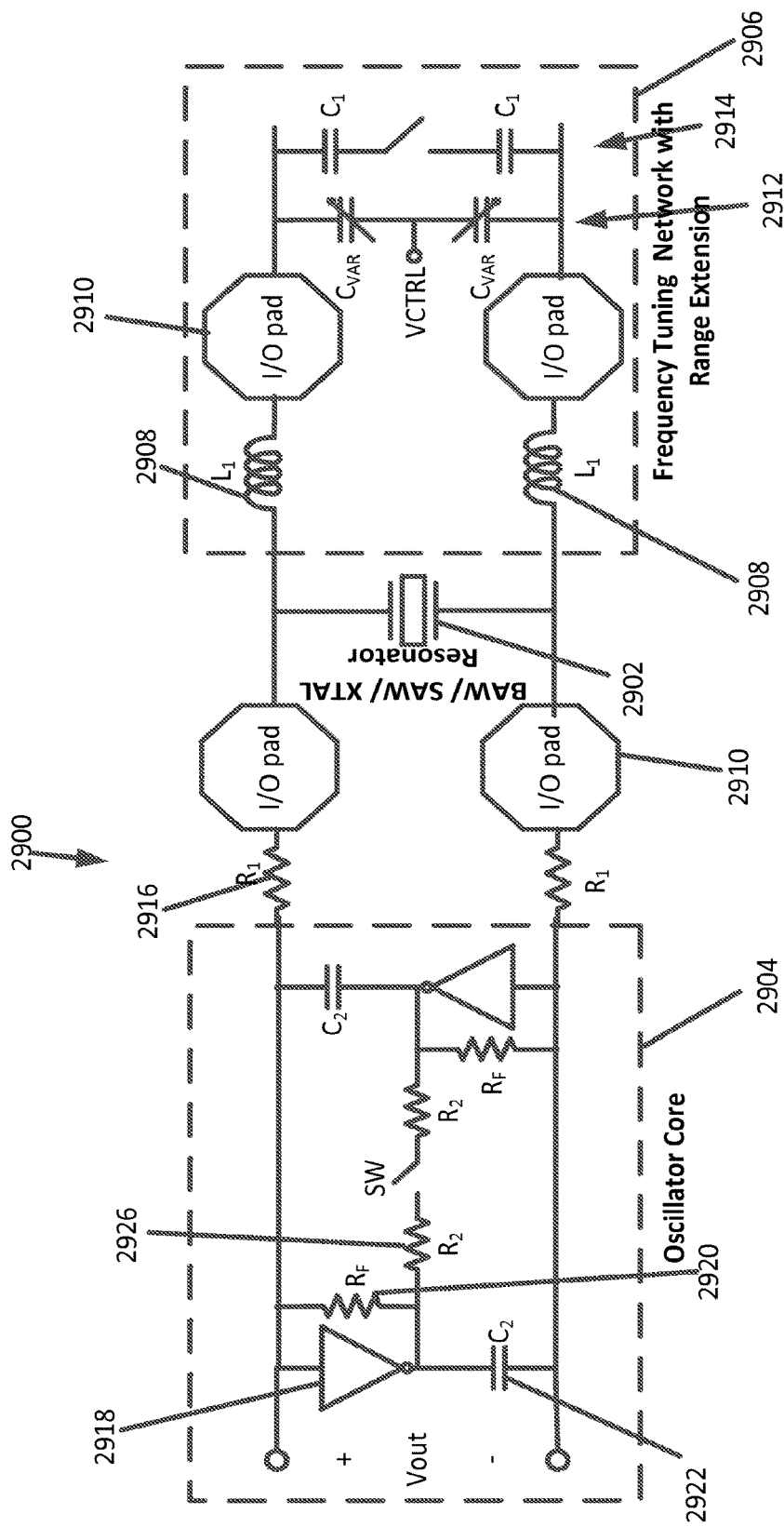
FIG. 29 shows an oscillator in accordance with another embodiment of the present disclosure.

FIG. 29 shows an oscillator 2900, similar to the oscillator 600 of FIG. 6, in accordance with another embodiment of the present disclosure. The oscillator 2900 comprises inductors 2908 which are placed in series between the frequency tuning network 2906 and the oscillator core 2904. The inductors 2908 isolate the oscillator core 2904 from the frequency tuning network 2906. The resonator 2902 is in parallel with both the oscillator core 2904 and the frequency tuning network 2906. The resonator 2902, however, is only separated by inductors 2908 from the frequency tuning network 2906. Input/output (I/O) pads 2910 separate the on-chip capacitive bank 2912, 2914 from the inductors 2908. The oscillator core 2904 is connected to the electro-mechanical resonator 2902 via another set of I/O pads 2910. The resonator 2902, inductors L1 2908, variable capacitors (varactors) $C_{VAR}$ 2912, and switchable capacitors $C_1$ 2914 form the resonator tank. The oscillator core 2904 comprises two capacitively cross-coupled (or back-to-back-connected) inverting gain stages 2918 with feedback resistors $R_F$ 2920.

Placing the inductors 2908 between the oscillator core 2904 and the tuning network 2906, with the resonator 2902 between the oscillator core 2904 and the inductors 2908, helps inhibit or isolate parasitic capacitances of the oscillator core 2904 from being amplified by the inductors 2908 as seen by the resonator 2902 (i.e. the effective capacitance from the oscillator core in parallel with the resonator is not amplified). Rather the inductors 2908 have the opposite effect by not amplifying the fixed parasitic capacitance from the oscillator core as seen by the resonator 2902. A smaller fixed parasitic capacitance in this manner helps achieve a wider frequency tuning range by increasing the ratio of the variable capacitance to total capacitance through lowering the amount of minimum fixed capacitance. This means a wider tuning range is achieved without increasing the amount of variable capacitance in the frequency tuning network, thus mitigating ways of phase noise degradation. Increasing the amount of variable capacitor (varactor) to increase the tuning range would increase the oscillation phase noise through AM-to-PM conversion of noise sources.

Other benefits may also be realized by placing the inductors 2908 in series between the oscillator core 2904 and the frequency tuning network 2906. For example, the inductors 2908 help inhibit or isolate the frequency tuning network 2906 from amplifying phase noise in the oscillator core 2904. To put it another way, the inductors help inhibit conversion of inverter thermal amplitude noise (especially high-frequency components) to phase noise when the varactor is modulated. This would permit larger capacitances to be used in the frequency tuning network 2906 without degrading the phase noise quality of the oscillations. In other words, the arrangement helps avoid the trade-off between frequency tuning range and phase noise performance. Furthermore, the resonator's quality (Q) factor may increase because the overall capacitive load on the resonator decreases. The Q factor of resonator decreases with increase in shunt (parallel) capacitance.

Isolating an oscillator core from a frequency tuning network with, for example, an inductor, to improve the frequency tuning range and reduce phase noise is not limited to any particular type of oscillator, so long as the oscillator comprises an electro-mechanical resonator. For example, the arrangement may be used in balanced oscillators with BJT or JFET transistors or complementary MOS (CMOS) cross-coupled inverters, or in single-ended oscillators. Any electronic element that inductively connects the frequency tuning network 2906 to the oscillator 2900 may also be used, and this is not limited to an inductor per se.

Figure 30:
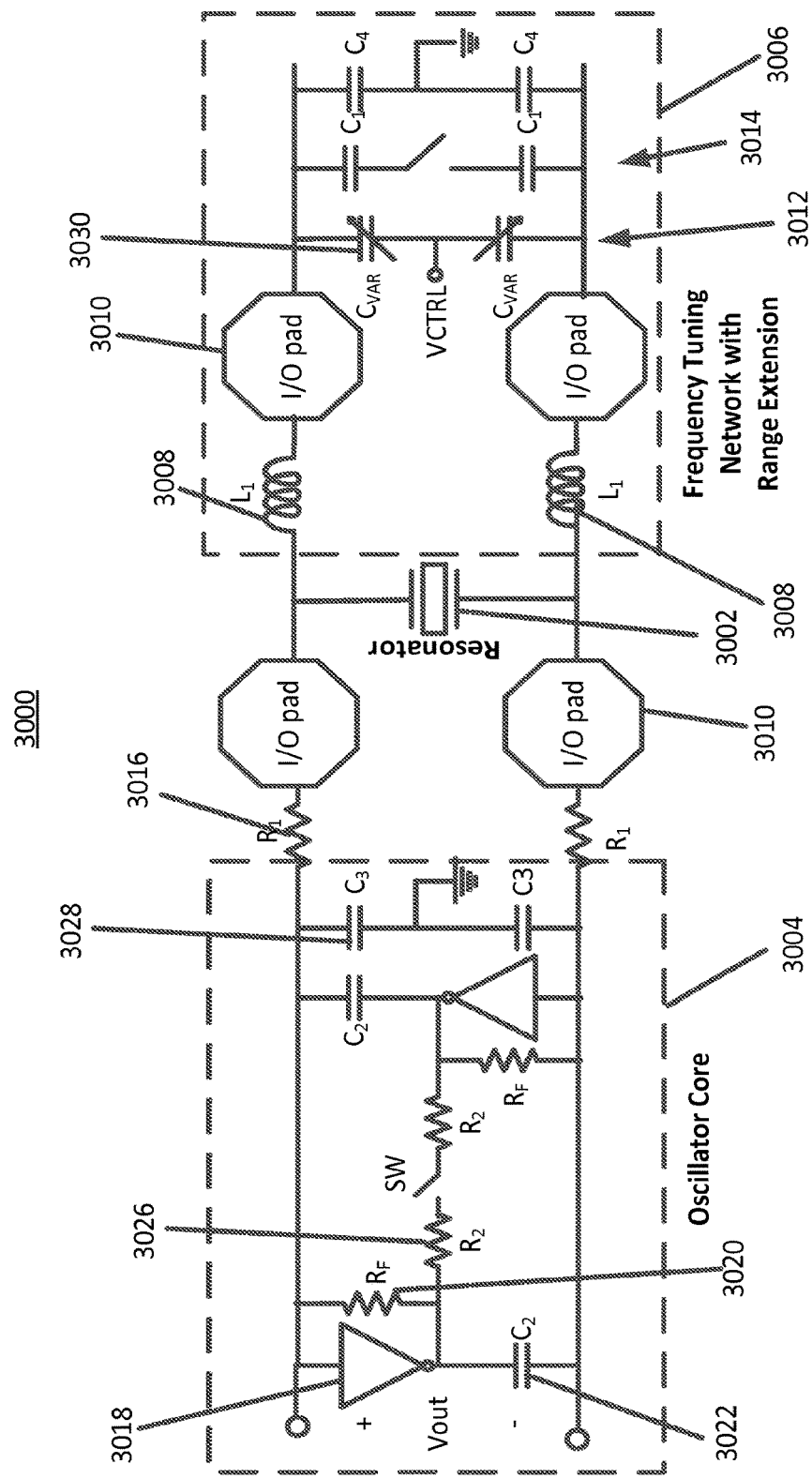
FIG. 30 shows an oscillator in accordance with an embodiment of the present disclosure, including parasitic capacitances.

FIG. 30 shows an oscillator 3000 similar to the oscillator 2900 shown in FIG. 29, the difference being that additional elements have been shown to model certain parasitic capacitances such as $C_3$ 3028. Resistors $R_1$ 3016 provide low-pass filtering which inhibits unwanted high-frequency oscillation from the parasitic inductances of the IC package, or overtone modes of the resonator, from occurring in the oscillator 3000. Capacitors $C_2$ 3022 break the positive feedback loop of the complementary cross-coupled gain stage at DC. Self-biasing feedback resistors $R_F$ 3020 bias the gain stage to maximize gain. The switchable resistor network formed by $R_2$ 3026 provides high-pass filtering to eliminate unwanted low frequency relaxation-mode oscillations when the switch is closed. Each of the above-noted elements, however, can also contribute phase noise or parasitic capacitance to the oscillator 3000.

Resistors $R_F$ 3020 and $R_1$ 3016, and inverters 3018 generate thermal noise. Thermal noise on amplitude may be converted into phase noise by the voltage variable capacitors $C_{VAR}$ 3030 in the oscillator's tuning network. Capacitances $C_3$ 3028 model the parasitic capacitances from the inverters 3018 and bottom plate capacitance of capacitors $C_2$ 3022. Parasitic capacitances $C_3$ 3028 increase the fixed capacitance load in the oscillator core 3004 and degrade the tuning range.

Referring again to FIG. 6, although inductors $L_1$ 608 improve the overall frequency tuning range by amplifying the on-die capacitance bank ($C_{VAR}$ and $C_1$) seen by the resonator 602, since the oscillator core 604 is connected directly to the frequency tuning network 606, the fixed parasitic capacitances of the oscillator core 604 are also amplified. Amplification of the fixed parasitic capacitances bounds or restricts the ratio of variable capacitance to fixed capacitance upon which the frequency tuning range depends.

Isolating the oscillator core 3004 from the frequency tuning network 3006 with inductors 3008 as shown in FIG. 30, however, inhibits amplification of the fixed and parasitic capacitance $C_3$ 3028 thus further improving the frequency tuning range. Although the inductors 3008 are shown inside the frequency tuning network, the frequency tuning network is a collection of structures and it should be understood that the inductors may be defined to reside physically outside of the frequency tuning network (i.e. the inductors may be in the IC package, while the capacitors are on silicon die) but in the same relative position with respect to the resonator, along with the capacitors for controlling the frequency of the oscillations.

In oscillators with high-Q resonators, phase noise is directly correlated with the loaded Q factor ($Q_{loaded}$) of the resonator. The larger the $Q_{loaded}$ value, the of better the phase noise of the oscillations produced by the oscillator. The $Q_{loaded}$ valued is inversely proportional to the amount of capacitive load placed on the resonator. Isolating the oscillator core 3004 from the frequency tuning network 3006, accordingly, helps reduce the fixed capacitance load placed on the resonator which in turn increases the resonator's $Q_{loaded}$ value and ultimately improves phase noise.

Another advantage is that the inductors 3008 isolate the noise generated by noise sources such as $R_1$ 3006, $R_F$ 3020 and active devices (transistors) in the inverters 3018, from the frequency tuning network 3006. This helps to improve the phase noise.

Figure 31:
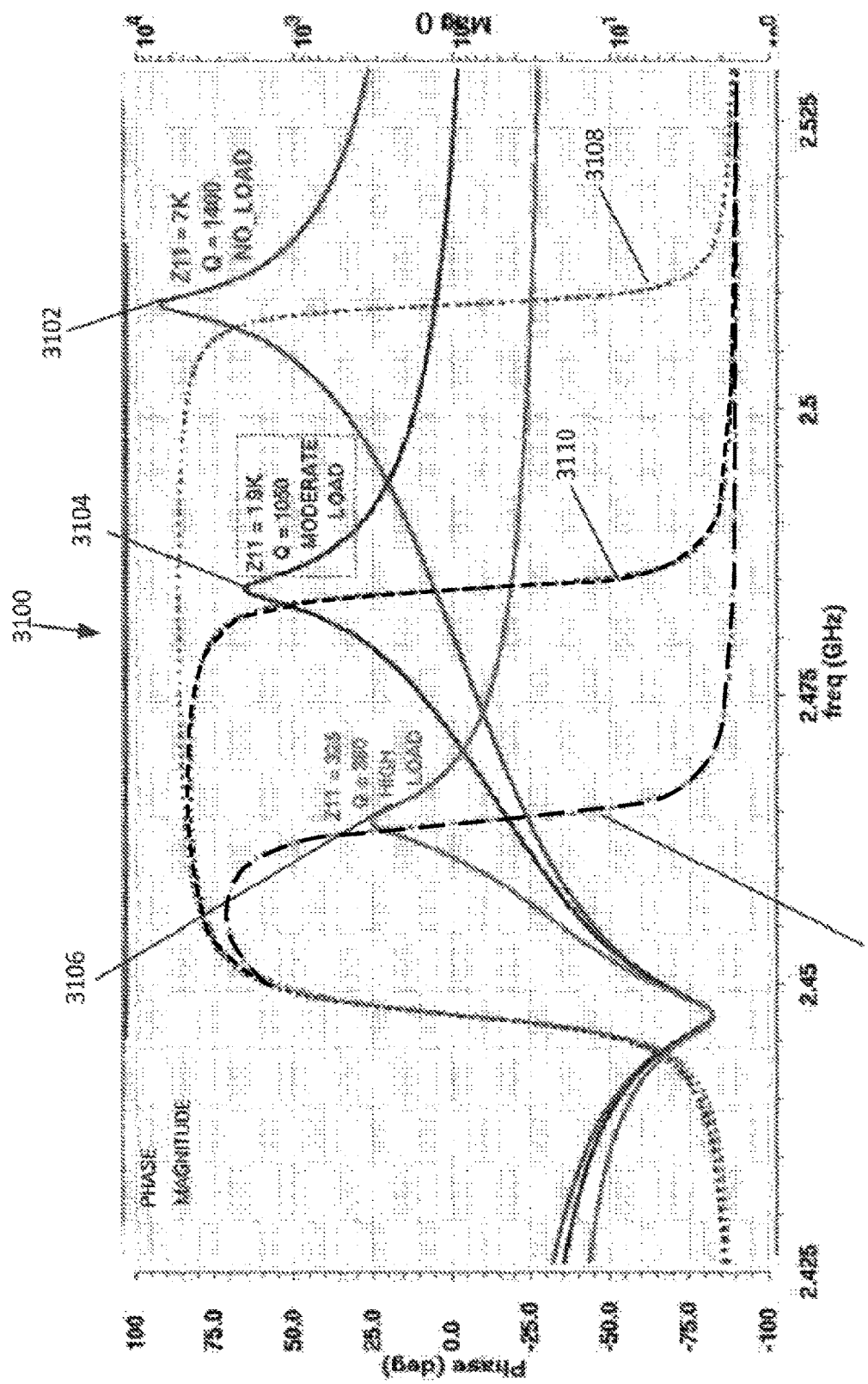
FIG. 31 shows a plot depicting the reduction in peak impedance magnitude and Q factor of a high-Q resonator with extra capacitive load shunting the resonator.

FIG. 31 shows a plot 3100 of the impedance magnitude and impedance phase for a high-Q electro-mechanical resonator at various frequencies; the higher frequencies in peak impedance magnitude correspond to lower capacitive loads on the resonator. The impedance magnitude plot for a resonator with no load 3102 (3108 is the corresponding phase curve) shows the sharpest magnitude response curve suggesting the highest Q. The plot for a resonator with moderate load 3104 (3110 is the corresponding phase curve) has its magnitude response curve somewhat flattened at the resonance peak that suggests smaller Q. The magnitude response plot for a resonator with highest capacitive load 3106 (3112 is the corresponding phase curve) has the most flattened (least selective) impedance curve at resonance frequency and hence the lowest Q among the group. As a result, reducing parasitic capacitive load on the resonator will improve Q which will in turn increase oscillation swing and decrease oscillation phase noise.

Devices and resistances connected to the resonator may cause thermal noise. Thermal noise may be converted into phase noise through AM-to-PM mechanism in voltage dependent capacitors. Accordingly, it is desirable to reduce the amount of thermal noise in the oscillator.

Figure 32:
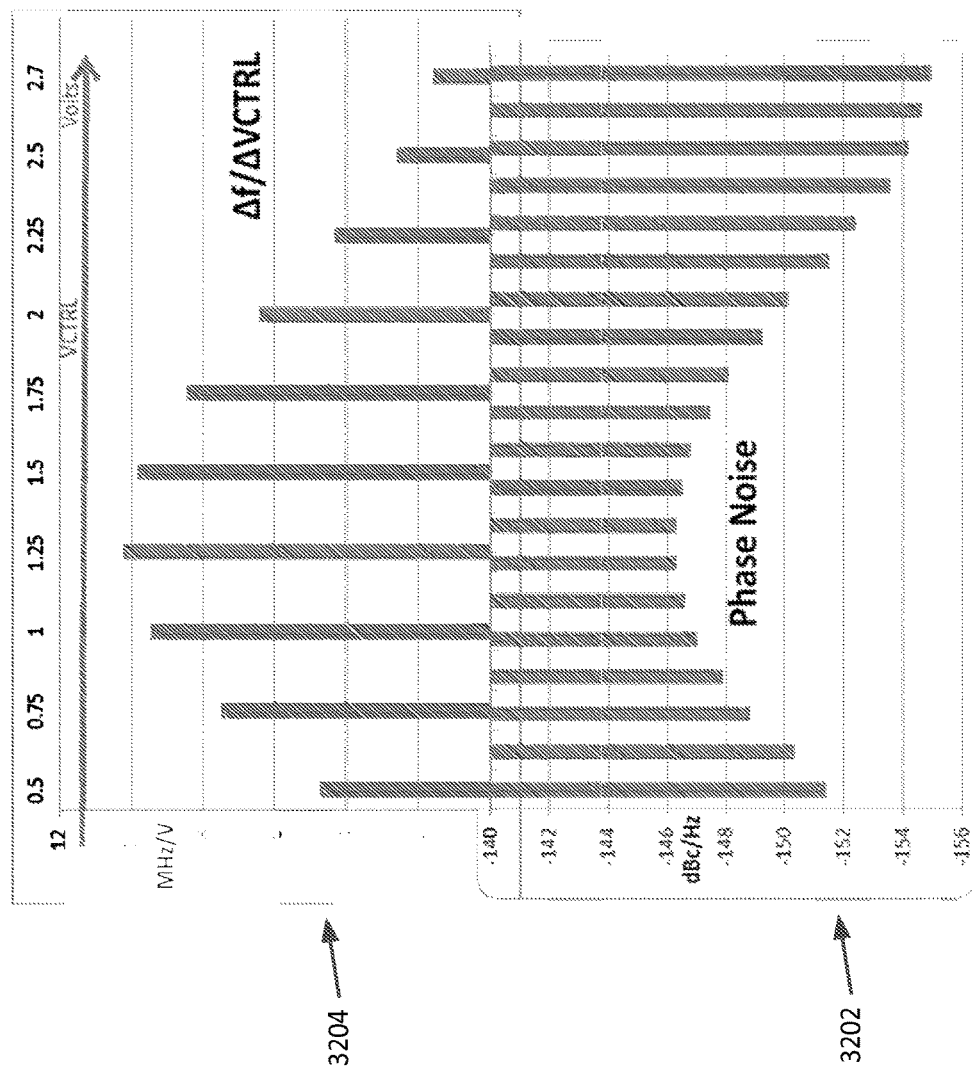
FIG. 32 shows plots of phase noise in dBc/Hz (bottom graph) and VCO gain in MHz/V (top graph) versus control voltage in an oscillator at 1 MHz offset from carrier across tuning range.

FIG. 32 shows a lower plot 3202 of phase noise in dBc/Hz across and an upper plot 3204 of VCO gain in MHz/V versus control voltage in an oscillator, similar to the oscillation shown in FIG. 30, at 1 MHz offset from carrier frequency. VCTRL refers to the amount of control voltage applied to varactors in the frequency tuning network for controlling the amount of capacitance and hence the oscillation frequency. The larger the VCTRL, the smaller the capacitance and the higher the frequency.

Capacitance (C) or frequency (f) does not change linearly with the control voltage. Upper plot 3204 shows the rate of change in oscillator frequency with respect to a change in control voltage. This parameter is known as VCO gain or $K_{vco}$ ($K_{vco}=\Delta f/\Delta VCTRL$). The change in capacitance or frequency over the change in voltage reaches a maximum at nearly half of the supply voltage (i.e., VCTRL=vdd/2).

Plots 3202, 3204 show that phase noise reaches a maximum level at the point where a small change in voltage results in a large change in frequency. The phase noise trend is attributed to thermal noise AM-to-PM conversion, namely, amplitude noise modulating the varactors and converting to phase noise. This phase noise maximizes where $K_{VCO}$ is maximized. The phase noise degradation effect is worse for an oscillator with higher tuning range and higher $K_{VCO}$ (i.e., higher $\Delta f/\Delta VCTRL$).

Isolating the oscillator core from the tuning network with a set of input/output pads and series inductors helps improve the phase noise by reducing the effect of noise generated by the oscillator core on the tuning network. Inhibiting fixed capacitor amplification helps reduce the capacitance size of the varactors for the same tuning range. Smaller varactors results in less AM-to-PM noise conversion thus improving the phase noise.

Figure 33:
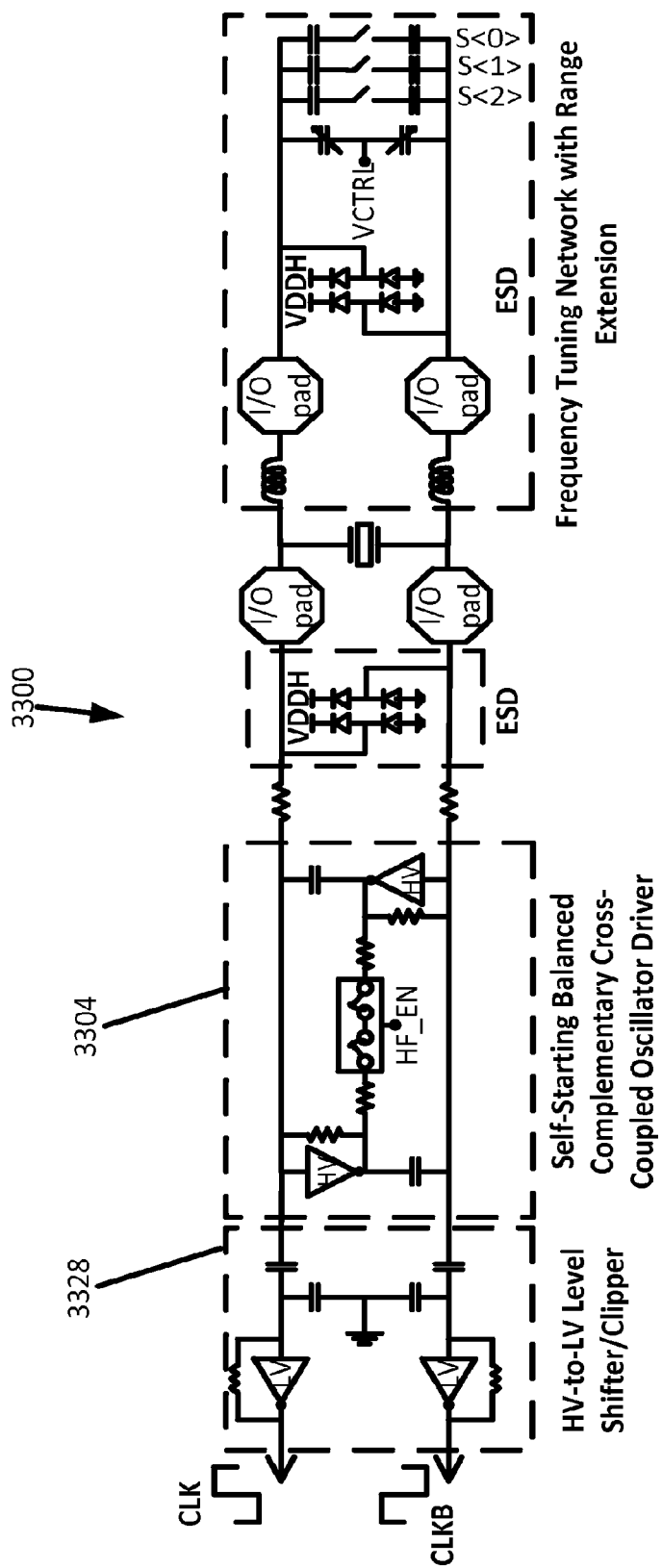
FIG. 33 shows an oscillator in accordance with another embodiment of the present disclosure.

FIG. 33 shows another embodiment of an oscillator 3300 in accordance with the present disclosure. The oscillator 3300 is similar to the oscillator 2900 of FIG. 29, the difference being the oscillator 3300 comprises practical implementation details such as a level shifter 3328 connected to the oscillator driver 3304 to level shift the oscillator output signal from a high-voltage (e.g., 2.5V) rail to a low-voltage (e.g., 1.0V) rail. A level shifter 3328 is also known as a hard-limiting amplifier. The oscillator 3300 produces a square-wave digital signal. The oscillator 3300 may be used in, for example, a high performance clock synthesizer (local oscillator, or LO) with an integrated jitter attenuator (JAT) PLL that generates low-jitter, low-phase-noise clock outputs for driving high performance data converters, RF synthesizers, serializer-deserializer (SERDES) interfaces, and digital signal processing (DSP) subsystems. The oscillator driver 3304 may be fabricated in a 65 nm CMOS process using 1-Volt and internally-regulated 2.5-Volt power supplies, and Deep-NWell option for noise isolation. In another embodiment, rather than a level shifter 3328, the oscillator 3300 can comprise a band-pass or a tuned amplifier for generating a sinusoidal output signal.

In the preceding description, for purposes of explanation, numerous details are set forth in order to provide a thorough understanding of the embodiments of the disclosure. However, it will be apparent to one skilled in the art that these specific details are not required. In other instances, well-known electrical structures and circuits are shown in block diagram form.

The above-described embodiments are intended to be examples only. Alterations, modifications, and variations may be effected to the particular embodiments by those of skill in the art without departing from the scope, which is defined solely by the claims appended hereto.

What is claimed is:

1. An oscillator comprising:
   an oscillator core configured for contributing gain to oscillations generated in the oscillator; and
   a frequency tuning network connected between the oscillator core and a signal source that provides an input signal for creating the oscillations in the oscillator, wherein the frequency tuning network is configured for tuning frequency of the oscillations, to inhibit amplifying a first capacitance from the oscillator core and to amplify a second capacitance from the frequency tuning network.

2. The oscillator of claim 1, wherein the oscillator core comprises one or more transistors for contributing gain to the oscillations to generate single-ended oscillations.

3. The oscillator of claim 1, wherein the oscillator core comprises cross-coupled transistors for contributing gain to the oscillations to generate balanced oscillations.

4. The oscillator of claim 1, wherein the oscillator core comprises complementary cross-coupled inverters for contributing gain to the oscillations to generate balanced oscillations.

5. The oscillator of claim 1, wherein the frequency tuning network comprises a switchable capacitor or a voltage controlled capacitor.

6. The oscillator of claim 1, wherein the frequency tuning network comprises:
   capacitors switchably connected to an input circuit, configured for receiving the input signal from the signal source, to form one or more switchable capacitor connections; and
   a controller configured to enable the one or more switchable capacitor connections to decrease the frequency of the balanced oscillations in the oscillator, and to disable the one or more switchable capacitor connections to increase the frequency of the balanced oscillations in the oscillator.

7. The oscillator of claim 1, further comprising an input circuit that is configured to receive the input signal from the signal source.

8. The oscillator of claim 1, wherein the signal source comprises a resonator, and the input signal comprises a resonator signal.

9. The oscillator of claim 8, further comprising a resonator input circuit that is connected to the resonator, the resonator input being configured to receive the resonator signal.

10. The oscillator of claim 8, wherein the resonator comprises a resonator inductor and a resonator capacitor.

11. The oscillator of claim 8, wherein the resonator comprises an electro-mechanical resonator.

12. The oscillator of claim 11, wherein the electro-mechanical resonator comprises a thin-film bulk acoustic resonator, a bulk acoustic wave resonator, a surface acoustic wave resonator, a micro-electro-mechanical system resonator, or a quartz crystal resonator.

13. A method comprising:
   generating oscillations in an oscillator using an input signal from a signal source;
   amplifying the oscillations;
   tuning frequency of the oscillations, the tuning comprising:
      varying a capacitance applied in parallel with the signal source and with a first component in the oscillator, wherein the first component is configured for applying the amplifying of the oscillations;
      inhibiting amplification of a first capacitance in the first component; and
      amplifying a second capacitance in a second component, wherein the second component is between the first component with the signal source.

14. The method of claim 13, wherein varying the capacitance comprises increasing the capacitance to decrease the frequency of the oscillations.

15. The method of claim 13, wherein varying the capacitance comprises decreasing the capacitance to increase the frequency of the oscillations.

16. The method of claim 13, comprising amplifying the second capacitance using an inductance connecting the first component and the signal source with the second component.

17. The method of claim 16, comprising inhibiting a parasitic capacitance from reaching the signal source using the inductance.

18. The method of claim 16, comprising inhibiting a noise from the first component from reaching the capacitance using the inductance.

19. The method of claim 13, wherein generating the oscillations comprises generating balanced oscillations.

20. The method of claim 13, wherein generating the oscillations comprises generating single-ended oscillations.

* * * * *